United States Patent
Henley

(10) Patent No.: US 8,293,619 B2
(45) Date of Patent: Oct. 23, 2012

(54) LAYER TRANSFER OF FILMS UTILIZING CONTROLLED PROPAGATION

(75) Inventor: Francois J. Henley, Aptos, CA (US)

(73) Assignee: Silicon Genesis Corporation, San Jose, CA (US)

( * ) Notice: Subject to any disclaimer, the term of this patent is extended or adjusted under 35 U.S.C. 154(b) by 616 days.

(21) Appl. No.: 12/460,898

(22) Filed: Jul. 24, 2009

(65) Prior Publication Data

US 2010/0055874 A1    Mar. 4, 2010

Related U.S. Application Data

(60) Provisional application No. 61/092,683, filed on Aug. 28, 2008.

(51) Int. Cl.
*H01L 21/30* (2006.01)
*H01L 21/46* (2006.01)

(52) U.S. Cl. ......... 438/458; 438/459; 438/520; 438/528

(58) Field of Classification Search .................. 438/458, 438/459, 520, 528
See application file for complete search history.

(56) References Cited

U.S. PATENT DOCUMENTS

| | | | |
|---|---|---|---|
| 2,614,055 A | 10/1952 | Senarelens | |
| 3,117,002 A | 1/1964 | Bronson et al. | |
| 3,225,820 A | 12/1965 | Riordan | |
| 3,390,033 A | 6/1968 | Brown | |
| 3,392,069 A | 7/1968 | Merkel et al. | |
| 3,551,213 A | 12/1970 | Boyle | |
| 3,770,499 A | 11/1973 | Crowe et al. | |
| 3,786,359 A | 1/1974 | King | |
| 3,806,380 A | 4/1974 | Kitada et al. | |
| 3,832,219 A | 8/1974 | Nelson et al. | |
| 3,900,636 A | 8/1975 | Curry et al. | |
| 3,901,423 A | 8/1975 | Hillberry et al. | |
| 3,915,757 A | 10/1975 | Engel | |
| 3,946,334 A | 3/1976 | Yonezu | |
| 3,957,107 A | 5/1976 | Alotz et al. | |
| 3,964,957 A | 6/1976 | Walsh | |
| 3,993,909 A | 11/1976 | Drews et al. | |
| 4,006,340 A | 2/1977 | Gorinas | |

(Continued)

FOREIGN PATENT DOCUMENTS

DE    834363    3/1952

(Continued)

OTHER PUBLICATIONS

Adan et al., SOI as a mainstream IC technology Proceedings 1998 IEEE International SOI conference, Oct. 1998, pp. 9-12.

(Continued)

*Primary Examiner* — Bac Au

(74) *Attorney, Agent, or Firm* — Kilpatrick Townsend & Stockton LLP

(57) ABSTRACT

A film of material may be formed by providing a semiconductor substrate having a surface region and a cleave region located at a predetermined depth beneath the surface region. During a process of cleaving the film from the substrate, shear in the cleave region is carefully controlled to achieve controlled propagation by either KII or energy propagation control. According to certain embodiments, an in-plane shear component (KII) is maintained near zero by adiabatic heating of silicon through exposure to E-beam radiation. According to other embodiments, a surface heating source in combination with an implanted layer serves to guide fracture propagation through the cleave sequence.

34 Claims, 11 Drawing Sheets

Heat Soak to raise absolute temperature

U.S. PATENT DOCUMENTS

| | | |
|---|---|---|
| 4,039,416 A | 8/1977 | White |
| 4,053,335 A | 10/1977 | Hu |
| 4,074,139 A | 2/1978 | Pankove |
| 4,107,350 A | 8/1978 | Berg et al. |
| 4,108,751 A | 8/1978 | King |
| 4,116,751 A | 9/1978 | Zaromb |
| 4,121,334 A | 10/1978 | Wallis |
| 4,170,662 A | 10/1979 | Weiss et al. |
| 4,216,906 A | 8/1980 | Olsen et al. |
| 4,237,601 A | 12/1980 | Woolhouse et al. |
| 4,244,348 A | 1/1981 | Wilkes |
| 4,252,837 A | 2/1981 | Auton |
| 4,255,208 A | 3/1981 | Deutscher et al. |
| 4,274,004 A | 6/1981 | Kanai |
| 4,342,631 A | 8/1982 | White et al. |
| 4,346,123 A | 8/1982 | Kaufmann |
| 4,361,600 A | 11/1982 | Brown |
| 4,368,083 A | 1/1983 | Bruel et al. |
| 4,375,125 A | 3/1983 | Byatt |
| 4,412,868 A | 11/1983 | Brown et al. |
| 4,452,644 A | 6/1984 | Bruel et al. |
| 4,468,309 A | 8/1984 | White |
| 4,471,003 A | 9/1984 | Cann |
| 4,486,247 A | 12/1984 | Ecer et al. |
| 4,490,190 A | 12/1984 | Speri |
| 4,495,219 A | 1/1985 | Kato et al. |
| 4,500,563 A | 2/1985 | Ellenberger et al. |
| 4,508,056 A | 4/1985 | Bruel et al. |
| 4,530,149 A | 7/1985 | Jastrzebski et al. |
| 4,536,657 A | 8/1985 | Bruel |
| 4,539,050 A | 9/1985 | Kramler et al. |
| 4,566,403 A | 1/1986 | Fournier |
| 4,567,505 A | 1/1986 | Pease et al. |
| 4,568,563 A | 2/1986 | Jackson et al. |
| 4,585,945 A | 4/1986 | Bruel et al. |
| 4,645,546 A | 2/1987 | Matsushita |
| 4,684,535 A | 8/1987 | Heinecke et al. |
| 4,704,302 A | 11/1987 | Bruel et al. |
| 4,706,377 A | 11/1987 | Shuskus |
| 4,717,683 A | 1/1988 | Parillo |
| 4,727,047 A | 2/1988 | Bozler et al. |
| 4,764,394 A | 8/1988 | Conrad |
| 4,766,086 A | 8/1988 | Oshima et al. |
| 4,837,172 A | 6/1989 | Mizuno et al. |
| 4,846,928 A | 7/1989 | Dolins et al. |
| 4,847,792 A | 7/1989 | Barna et al. |
| 4,853,250 A | 8/1989 | Boulos et al. |
| 4,883,561 A | 11/1989 | Gmitter et al. |
| 4,887,005 A | 12/1989 | Rough et al. |
| 4,891,329 A | 1/1990 | Reismann et al. |
| 4,894,709 A | 1/1990 | Phillips et al. |
| 4,906,594 A | 3/1990 | Yoneda |
| 4,931,405 A | 6/1990 | Kamijo et al. |
| 4,948,458 A | 8/1990 | Ogle |
| 4,952,273 A | 8/1990 | Popov |
| 4,956,693 A | 9/1990 | Sawahata et al. |
| 4,960,073 A | 10/1990 | Suzuki et al. |
| 4,982,090 A | 1/1991 | Wittmaack |
| 4,983,251 A | 1/1991 | Haisma et al. |
| 4,996,077 A | 2/1991 | Moslehi et al. |
| 5,015,353 A | 5/1991 | Hubler et al. |
| 5,034,343 A | 7/1991 | Rouse et al. |
| 5,070,040 A | 12/1991 | Pankove |
| 5,082,793 A | 1/1992 | Li |
| 5,102,821 A | 4/1992 | Moslehi |
| 5,110,748 A | 5/1992 | Sarma |
| 5,133,826 A | 7/1992 | Dandl |
| 5,141,878 A | 8/1992 | Benton et al. |
| 5,162,241 A | 11/1992 | Mori et al. |
| 5,196,355 A | 3/1993 | Wittkower |
| 5,198,071 A | 3/1993 | Scudder et al. |
| 5,198,371 A | 3/1993 | Li |
| 5,202,095 A | 4/1993 | Houchin et al. |
| 5,203,960 A | 4/1993 | Dandl |
| 5,206,749 A | 4/1993 | Zavracky et al. |
| 5,213,451 A | 5/1993 | Frank |
| 5,213,986 A | 5/1993 | Pinker et al. |
| 5,234,529 A | 8/1993 | Johnson |
| 5,234,535 A | 8/1993 | Beyer et al. |
| 5,242,861 A | 9/1993 | Inaba |
| 5,250,328 A | 10/1993 | Otto |
| 5,252,178 A | 10/1993 | Moslehi |
| 5,256,562 A | 10/1993 | Vu et al. |
| 5,258,320 A | 11/1993 | Zavracky et al. |
| 5,258,325 A | 11/1993 | Spitzer et al. |
| 5,269,880 A | 12/1993 | Jolly et al. |
| 5,273,610 A | 12/1993 | Thomas, III et al. |
| 5,277,748 A | 1/1994 | Sakaguchi et al. |
| 5,303,574 A | 4/1994 | Matossian et al. |
| 5,304,509 A | 4/1994 | Sopori |
| 5,308,776 A | 5/1994 | Gotou |
| 5,317,236 A | 5/1994 | Zavracky et al. |
| 5,342,472 A | 8/1994 | Imahashi et al. |
| 5,344,524 A | 9/1994 | Sharma et al. |
| 5,354,381 A | 10/1994 | Sheng |
| 5,362,671 A | 11/1994 | Zavracky et al. |
| 5,363,603 A | 11/1994 | Miller et al. |
| 5,368,710 A | 11/1994 | Chen et al. |
| 5,370,765 A | 12/1994 | Dandl |
| 5,374,564 A | 12/1994 | Bruel |
| 5,376,560 A | 12/1994 | Aronowitz et al. |
| 5,377,031 A | 12/1994 | Vu et al. |
| 5,403,434 A | 4/1995 | Moslehi |
| 5,404,079 A | 4/1995 | Ohkuni et al. |
| 5,405,480 A | 4/1995 | Benzing et al. |
| 5,409,563 A | 4/1995 | Cathey |
| 5,411,592 A | 5/1995 | Ovshinsky et al. |
| 5,413,679 A | 5/1995 | Godbey |
| 5,427,052 A | 6/1995 | Ohta et al. |
| 5,435,880 A | 7/1995 | Minato et al. |
| 5,438,241 A | 8/1995 | Zavracky et al. |
| 5,443,661 A | 8/1995 | Oguro et al. |
| 5,444,557 A | 8/1995 | Spitzer et al. |
| 5,459,016 A | 10/1995 | Debe et al. |
| 5,475,514 A | 12/1995 | Salerno et al. |
| 5,476,691 A | 12/1995 | Komvopoulos et al. |
| 5,480,842 A | 1/1996 | Clifton et al. |
| 5,487,785 A | 1/1996 | Horiike et al. |
| 5,494,835 A | 2/1996 | Bruel |
| 5,504,328 A | 4/1996 | Bonser |
| 5,506,176 A | 4/1996 | Takizawa |
| 5,508,207 A | 4/1996 | Horai et al. |
| 5,514,235 A | 5/1996 | Mitani et al. |
| 5,518,965 A | 5/1996 | Menigaux |
| 5,528,397 A | 6/1996 | Zavracky et al. |
| 5,539,245 A | 7/1996 | Imura et al. |
| 5,558,718 A | 9/1996 | Leung |
| 5,559,043 A | 9/1996 | Bruel |
| 5,569,620 A | 10/1996 | Linn et al. |
| 5,581,385 A | 12/1996 | Spitzer et al. |
| 5,585,304 A | 12/1996 | Hayashi et al. |
| 5,611,855 A | 3/1997 | Wijaranakula |
| 5,643,834 A | 7/1997 | Harada et al. |
| 5,653,811 A | 8/1997 | Chan |
| 5,686,980 A | 11/1997 | Hirayama et al. |
| 5,700,333 A | 12/1997 | Yamazaki et al. |
| 5,705,421 A | 1/1998 | Matsushita et al. |
| 5,710,057 A | 1/1998 | Kenney |
| 5,714,395 A | 2/1998 | Bruel |
| 5,744,852 A | 4/1998 | Linn et al. |
| 5,753,560 A | 5/1998 | Hong et al. |
| 5,755,914 A | 5/1998 | Yonehara |
| 5,763,319 A | 6/1998 | Ling et al. |
| 5,783,022 A | 7/1998 | Cha et al. |
| 5,793,913 A | 8/1998 | Kovacic |
| 5,804,086 A | 9/1998 | Bruel |
| 5,811,348 A | 9/1998 | Matsushita et al. |
| 5,821,158 A | 10/1998 | Shishiguchi |
| 5,824,595 A | 10/1998 | Igel et al. |
| 5,827,751 A | 10/1998 | Nuyen |
| 5,840,590 A | 11/1998 | Myers, Jr. et al. |
| 5,841,931 A | 11/1998 | Foresi |
| 5,854,123 A | 12/1998 | Sato et al. |
| 5,863,830 A | 1/1999 | Bruel et al. |
| 5,869,387 A | 2/1999 | Sato et al. |
| 5,869,405 A | 2/1999 | Gonzalez et al. |
| 5,877,070 A | 3/1999 | Goesele et al. |

| | | | | | | |
|---|---|---|---|---|---|---|
| 5,882,987 A | 3/1999 | Srikrishnan | | 2005/0118754 A1 | 6/2005 | Henley et al. |
| 5,897,743 A | 4/1999 | Fujimoto et al. | | 2005/0189013 A1 | 9/2005 | Hartley |
| 5,906,951 A | 5/1999 | Chu et al. | | 2006/0014366 A1 | 1/2006 | Currie |
| 5,909,627 A | 6/1999 | Egloff | | 2006/0030122 A1 | 2/2006 | Shimoda et al. |
| 5,920,764 A | 7/1999 | Hanson et al. | | 2006/0038182 A1 | 2/2006 | Rogers et al. |
| 5,942,050 A | 8/1999 | Green et al. | | 2007/0122926 A1* | 5/2007 | Martinez et al. ................ 438/34 |
| 5,953,622 A | 9/1999 | Lee et al. | | | | |
| 5,966,620 A | 10/1999 | Sakaguchi et al. | | FOREIGN PATENT DOCUMENTS | | |
| 5,966,625 A | 10/1999 | Zhong et al. | | DE | 19753494 | 10/1998 |
| 5,968,279 A | 10/1999 | MacLeish et al. | | EP | 084287 A1 | 7/1983 |
| 5,985,742 A | 11/1999 | Henley et al. | | EP | 099778 A1 | 2/1984 |
| 5,993,677 A | 11/1999 | Biasse et al. | | EP | 155875 A1 | 2/1984 |
| 5,994,207 A | 11/1999 | Henley et al. | | EP | 112238 A2 | 6/1984 |
| 6,004,868 A | 12/1999 | Rolfson et al. | | EP | 181249 A1 | 5/1986 |
| 6,008,128 A | 12/1999 | Habuka et al. | | EP | 112230 A1 | 4/1987 |
| 6,010,579 A | 1/2000 | Henley et al. | | EP | 0296804 | 12/1988 |
| 6,013,563 A | 1/2000 | Henley et al. | | EP | 164281 A1 | 2/1989 |
| 6,013,567 A | 1/2000 | Henley et al. | | EP | 355913 A1 | 2/1990 |
| 6,020,252 A | 2/2000 | Aspar et al. | | EP | 379828 | 8/1990 |
| 6,027,988 A | 2/2000 | Cheung et al. | | EP | 459177 | 12/1991 |
| 6,033,974 A | 3/2000 | Henley et al. | | EP | 504714 A2 | 9/1992 |
| 6,048,411 A | 4/2000 | Henley et al. | | EP | 533551 A1 | 3/1993 |
| 6,066,915 A | 5/2000 | Pepi | | EP | 0553852 | 8/1993 |
| 6,077,383 A | 6/2000 | Laporte | | EP | 660140 A1 | 6/1995 |
| 6,083,324 A | 7/2000 | Henley et al. | | EP | 665587 A1 | 8/1995 |
| 6,103,599 A | 8/2000 | Henley et al. | | EP | 0665588 A1 | 8/1995 |
| 6,107,213 A | 8/2000 | Tayanaka | | EP | 703609 A1 | 3/1996 |
| 6,107,653 A | 8/2000 | Fitzgerald | | EP | 763849 A1 | 3/1997 |
| 6,120,597 A | 9/2000 | Levy et al. | | EP | 0807970 | 11/1997 |
| 6,143,628 A | 11/2000 | Sato et al. | | EP | 0843344 | 5/1998 |
| 6,150,239 A | 11/2000 | Goesele et al. | | EP | 867917 A2 | 9/1998 |
| 6,159,824 A | 12/2000 | Henley et al. | | EP | 867921 A2 | 9/1998 |
| 6,162,705 A | 12/2000 | Henley et al. | | EP | 0905767 | 3/1999 |
| 6,171,965 B1 | 1/2001 | Kang | | EP | 961312 A2 | 12/1999 |
| 6,171,982 B1 | 1/2001 | Sato | | EP | 0971395 | 1/2000 |
| 6,184,111 B1 | 2/2001 | Henley et al. | | EP | 1085562 | 3/2001 |
| 6,190,998 B1 | 2/2001 | Bruel et al. | | FR | 1558881 | 2/1969 |
| 6,191,007 B1 | 2/2001 | Matsui et al. | | FR | 2235474 A1 | 1/1975 |
| 6,194,327 B1 | 2/2001 | Gonzalez et al. | | FR | 2261802 A1 | 9/1975 |
| 6,204,151 B1 | 3/2001 | Malik et al. | | FR | 2266304 A | 10/1975 |
| 6,214,701 B1 | 4/2001 | Matsushita et al. | | FR | 2298880 A1 | 8/1976 |
| 6,225,192 B1 | 5/2001 | Aspar et al. | | FR | 2519437 A1 | 7/1983 |
| 6,251,754 B1 | 6/2001 | Ohshima et al. | | FR | 2529383 A1 | 12/1983 |
| 6,263,941 B1 | 7/2001 | Bryan et al. | | FR | 2575601 A1 | 7/1984 |
| 6,274,464 B2 | 8/2001 | Drobny et al. | | FR | 2537768 A1 | 8/1985 |
| 6,287,941 B1 | 9/2001 | Kang et al. | | FR | 2560426 A1 | 8/1985 |
| 6,291,321 B1 | 9/2001 | Fitzgerald | | FR | 2563377 A1 | 10/1985 |
| 6,294,478 B1 | 9/2001 | Sakaguchi et al. | | FR | 2537777 A1 | 4/1986 |
| 6,335,269 B1 | 1/2002 | Sato | | FR | 2681472 A1 | 3/1993 |
| 6,342,436 B1 | 1/2002 | Takizawa | | FR | 2714524 A1 | 6/1995 |
| 6,376,806 B2 | 4/2002 | Yoo | | FR | 2715501 A1 | 7/1995 |
| 6,452,091 B1 | 9/2002 | Nakagawa et al. | | FR | 2715502 A1 | 7/1995 |
| 6,455,397 B1 | 9/2002 | Belford | | FR | 2715503 | 7/1995 |
| 6,455,399 B2 | 9/2002 | Malik et al. | | FR | 2720189 A1 | 11/1995 |
| 6,503,773 B2 | 1/2003 | Fitzgerald | | FR | 2725074 A1 | 3/1996 |
| 6,513,564 B2 | 2/2003 | Bryan et al. | | GB | 2211991 A | 7/1989 |
| 6,514,836 B2 | 2/2003 | Belford | | GB | 2231197 A | 11/1990 |
| 6,534,381 B2 | 3/2003 | Cheung et al. | | JP | 53-104156 A | 9/1978 |
| 6,563,152 B2 | 5/2003 | Roberts et al. | | JP | 58-030145 | 2/1983 |
| 6,621,131 B2 | 9/2003 | Murthy et al. | | JP | 58-144475 A | 8/1983 |
| 6,723,661 B2 | 4/2004 | Fitzgerald | | JP | 59-046750 A | 3/1984 |
| 6,809,009 B2 | 10/2004 | Aspar et al. | | JP | 59-054217 A | 3/1984 |
| 6,858,107 B2 | 2/2005 | Ghyselen et al. | | JP | 59-114744 A | 7/1984 |
| 6,884,697 B2* | 4/2005 | Schwarzenbach et al. ... 438/464 | | JP | 59-139539 | 8/1984 |
| 6,911,376 B2 | 6/2005 | Yoo | | JP | 59-193904 | 11/1984 |
| 6,969,668 B1 | 11/2005 | Kang et al. | | JP | 60-207237 A | 10/1985 |
| 7,019,339 B2 | 3/2006 | Atwater | | JP | 60-235434 A2 | 11/1985 |
| 7,354,815 B2 | 4/2008 | Henley | | JP | 61-125012 | 6/1986 |
| 7,825,002 B2* | 11/2010 | Takayama et al. ............ 438/406 | | JP | 3-109731 A | 5/1991 |
| 2001/0019371 A1 | 9/2001 | Zavracky et al. | | JP | 3-132055 A | 6/1991 |
| 2001/0039095 A1 | 11/2001 | Marty | | JP | 3-265156 A | 11/1991 |
| 2002/0174828 A1 | 11/2002 | Vasat et al. | | JP | 4-076503 | 3/1992 |
| 2003/0077885 A1 | 4/2003 | Aspar et al. | | JP | 4-246594 A | 9/1992 |
| 2003/0096098 A1 | 5/2003 | Ovshinsky et al. | | JP | 4-298023 A | 10/1992 |
| 2003/0140844 A1 | 7/2003 | Maa et al. | | JP | 5-211128 A | 8/1993 |
| 2003/0186493 A1 | 10/2003 | Iwasaki et al. | | JP | 5-218053 | 8/1993 |
| 2003/0216008 A1* | 11/2003 | Schwarzenbach et al. ... 438/458 | | JP | 7-164728 | 6/1995 |
| 2004/0188487 A1* | 9/2004 | Barge et al. ................... 225/103 | | JP | 7-215800 A | 8/1995 |
| 2004/0253794 A1 | 12/2004 | Faris | | JP | 7-254690 A | 10/1995 |

| JP | 7-263291 A | 10/1995 |
| JP | 8-097389 A | 4/1996 |
| JP | 10-200080 A | 7/1998 |
| JP | 10-275905 | 10/1998 |
| JP | 11-045840 A | 2/1999 |
| JP | 2901031 B2 | 6/1999 |
| JP | 2910001 B2 | 6/1999 |
| JP | 2000-94317 A | 4/2000 |
| WO | WO 9510718 A1 | 4/1995 |
| WO | WO 9520824 A1 | 8/1995 |
| WO | WO 9531825 A1 | 11/1995 |
| WO | WO 9935674 A1 | 7/1999 |
| WO | WO 0063965 | 10/2000 |
| WO | WO 0154175 | 7/2001 |

OTHER PUBLICATIONS

Alles et al., Thin Film Silicon on Insulator: An Enabling Technology, Semiconductor International, pp. 67-72 (1997).
Auberton-Herve, "SOI: Materials to Systems", International Electron Devices Meeting, 1996, San Francisco, CA, USA, Dec. 8-11, 1996, New York, NY, USA, IEEE, US, Dec. 8, 1996, pp. 3-10.
BASTA, Ion-Beam Implantation, High Technology (1985).
Belford et al., Performance-Augmented CMOS using Back-end Uniaxial Strain 2002 Device Research Conference, Santa Barbara, CA.
Brendel, A Novel Process for Ultrathin Monocrystalline Silicon Solar Cells on Glass, 14th European Photovoltaic Solar Energy Conference Barcelona, Spain, Jun. 30-Jul. 4, 1997.
Burggraff, Advanced Plasma Source: What's Working?, Semiconductor International, pp. 56-59 (May 1994).
Carter et al., "The Collection of IONS Implanted in Semiconductors II. Range distributions Derived from Collection and Sputter-Etch Curves,"Radiation Effects, vol. 16, pp. 107-114 (1972).
Cassidy, Ion Implantation Process Toughens Metalworking Tools, Modern Metals, pp. 65-67 (1984).
Centura EPI "Epitaxial Deposition Chamber Specifications" Brochure, Applied Materials, Mar. 1994.
Cheung, Plasma Immersion Ion Implantation for Semiconductor Processing, Material Chemistry and Physics, 46(2-3): 132-139 (1996).
Cho et al., "Vapor Etching of Silicon Substrates with HCl Gas" Journal of the Korean Institute of Electronic Engineering, Apr. 25, 1984, pp. 41-45, vol. 21, No. 5.
Choyke et al., A Comparative Study of Near-Surface Effects Due to Very High Fluence H+ Implantation in Single Crystal FZ, CZ, and Web SI, Mat. Res. Soc. Symp. Proc., 27:359-364 (1984).
Choyke et al., Implanted Hydrogen Effects at High Concentrations in Model Low Z Shielding Materials, J. Nuc. Mtrls., 122-23:1585-86 (1984).
Choyke et al., Mechanical Response of Single Crystal Si to Very High Fluence H+ Implantation, Nuc. Instr. Meth., 209-210:407-412 (1983).
Chuang et al., Design Considerations of SOI Digital CMOS VLSI, Proceedings 1998 IEEE International SOI Conference, Oct. 1998, pp. 5-8.
Chu et al., Plasma Immersion Ion Implantation—A Fledgling Technique for Semiconductor Processing, Materials Science and Engineering Reports: A Review Journal, R17(6-7): 207-280 (1996).
Chu et al., Recent Applications of Plasma Immersion Ion Implantation, Semiconductor International, pp. 165-172 (1996).
Chu, Synthesis of SOI Materials Using Plasma Immersion Ion Implantation, 1997 Mat. Res. Soc. Symp. Proc., 438:333-343 (1997).
Comita et al., Low Temperature SI and SIGe Epitaxy for sub 01.µm Technology, AMAT Conference Paper, Mar. 10, 2003.
Corbett et al., Embrittlement of Materials: Si(H) as a Model System, J. Nuc. Mtrls., 169: 179-184 (1989).
Deegan et al., Wavy and rough cracks in silicon. Center for Nonlinear Dynamics and Department of Physics, The University of Texas at Austin, Austin, Texas 78712, USA, Phys. Rev. E 67, 066209 (2003) [7 pages].
EPI Centura, Systems Specifications Brochure, Applied Materials, Oct. 1996.
European Patent Search Report for European Application No. 07016247.4, dated Apr. 24, 2008, 8 pages total.
European Patent Search Report for European Application No. 08153348.1, dated Jun. 3, 2008, 8 pages total.
Feijo et al., Pre stressing of Bonded Wafers, Proceedings of the First International Symposium on Semiconductor Wafer Bonding Science, Technology and Applications (Electrochemical Society, New York, 1992, v. 92.7, pp. 230-238.
Ge et al., Process-Strained Si (PSS) CMOS Technology Featuring 3D Strain Engineering, IEEE International Electron Devices Meeting, Washington, DC, Dec. 2003.
Grovernor, C.R.M., Microelectric Materials (1989), pp. 73-75.
Habuka et al., Change in Microroughness of a Silicon Surface during in Situ Cleaning Using HF and HCL Gases, Journal of the Electrochemical Society, Electrochemical Society, Manchester, NY, v. 145, No. 12, Dec. 1998, pp. 4264-4271.
Hobart et al., "Fabrication of SOI Substrates with Ultra-Thin Si Layers" Electronics Letters, IEE Stevenage, GB, vol. 34, No. 12, Jun. 11, 1998, pp. 1265-1267.
Hobart et al., "Ultra-Cut: A Simple Technique for the Fabrication of SOI Substrates with Ultra-Thin (>5 nm) Silicon Films," IEEE International SOI Conference, 1998. Proceedings, Stuart, FL, USA, Oct. 5-8, 1998, New York, NY, USA, IEEE, US, Oct. 5, 1998, pp. 145-146.
Hulett et al., Ion Nitriding and Ion Implantation: A Comparison, Metal Progress, pp. 18-21 (1985).
I.B.M., Technical Disclosure Bulletin, vol. 29: No. 3, p. 1416 (Aug. 1986).
International Search Report and Written Opinion of PCT Application No. PCT/US07/78023, date of mailing Jul. 25, 2008, 13 pages total.
IQE'S Smooth Approach Increases Carrier Mobilities, News, www.compoundsemiconductor.net, Dec. 2004.
Johnson et al., Hydrogen-Induced Platelets in Silicon: Separation of Nucleation and Growth, Mtrls. Sci. Forum, 83-87:33-38 (1992).
Krivokapic et al., "Strain Relaxation in Narrow Width Strained Silicon Devices with Poly and Metal Gates", Electrochemical Society Proceedings vol. 2004-07, pp. 459-469, Pennington, New Jersey USA (2004).
Lawn, Fracture of Brittle Solids, Second Edition, NIST Fellow, Cambridge University Press, pp. 1-13.
Lee et al., A Novel Pattern Transfer Process for Bonded SOI Giga-bit DRAMS, 1996 IEEE Int'l. SOI Conference Proceedings, IEEE Electron Devices Society, (1996).
Lee et al., Strained Silicon Thin-Film Transistors Fabricated on Glass, Appl. Phys. Lett. 86, 103504 (2005).
Li, Novel Semiconductor Substrate Formed by Hydrogen Ion Implantation into Silicon, Appl. Phys. Lett., 55(21):2223-2224 (1989).
Lu et al., SOI Material Technology Using Plasma Immersion Ion Implantation, Proceedings 1996 IEEE International SOI Conference (Oct. 1996).
Mahajan et al., Principles of Growth and Processing Semiconductors, WCB McGraw-Hill, chapter 6, pp. 262-269. (1999).
Mantl et al. Enhanced Strain Relaxation of Epitaxial SiGe-Layers ON Si(100) Improved by Hydrogen Implantation, Nuclear Instruments and Methods in Physics Research Section B, Jan. 1999, v. 147, Issue 1-4, p. 29-34.
Matsuda et al., Large Diameter Ion Beam Implantation System, Nuclear Instruments and Methods, B21:314-316 (1987).
Merriam Webster's Collegiate Dictionary, $10^{th}$ Ed., p. 388.
Milnes et al., Peeled Film Technology for Solar Cells, pp. 338-341. (1975).
Moreau, Semiconductor Lithography, Principles, Practices, and Materials, Plenum Press (1988).
Moriceau et al., Hydrogen Annealing Treatment Used to Obtain High Quality SOI Surfaces, Proceedings of 1998 IEEE Int. SOI Conference, pp. 37-38 from conference held Oct. 5-8, 1998.
Morrison et al., Deposition of Micro-Crystalline Silicon using a Graphite Filament in the Hot Wire CVD Technique, J. Vac. Sci. Technol A19 (6), Nov./Dec. 2001, p. 2817.
Mukashev et al., Hydrogen Implantation into Silicon: Infra-Red Absorption Spectra and Electrical Properties, Institute of High Energy Physics, Academy of Sciences of the Kazakh SSR, Alma-Ata 1; 91, 509 (1985).
Onojima et al., Lattice Relaxation Process of A1N Growth on Atomically Flat 6H-SIC Substrate in Molecular Beam Epitaxy, Journal of Crystal Growth, North-Holland Publishing Co., Amsterdam, NL, v. 2370239, Apr. 2002, pp. 1012-1016.

Oshima et al., Defects in Si Irradiated with D-T neutrons, D and He Ions, J. Nuc. Mtrls., 179-181:947-950 (1991).

Picraux et al., Ion Implantation of Surfaces, Scientific American, 252(3):102-113 (1985).

Renier et al., A New Low-Energy Ion Implanter for Bombardment of Cylindrical Surfaces, Vacuum, 35(12):577-578 (1985).

Saenger et al., Amorphization/templated recrystallization Method for Changing the Orientation of Single-Crystal Silicon: An Alternative Approach to Hybrid Orientation Substrates, Appl. Phys. Lett. 87, 221911, 2005.

Sato et al., Suppression of Si Etching During Hydrogen Annealing of Silicon-on-Insulator, Proceedings of 1998 IEEE Int. SOI Conferences pp. 17-18 from conference held Oct. 5-8, 1998.

Sherman et al., Energy Considerations in Crack Deflection Phenomenon in Single Crystal Silicon, International Journal of Fracture, vol. 140, No. 1-4, 2006 , pp. 125-140(16).

Sioshansi, Ion Beam Modification of Materials for Industry, Thin Solid Film, 118:61-71 (1984).

Smith, Thin Film Deposition, McGraw-Hill Inc., pp. 185-196, 278-293. (1995).

Sze, VLSI Technology, 2nd Edition, pp. 9-101, (1988).

Tate et al., Defect Reduction of Bonded SOI Wafers by Post Anneal Process in H/sub 2/Ambient, Proceedings of 1998 IEEE Int. SOI Conference, pp. 141-142 from conference held Oct. 5-8, 1998.

Thompson, Strained Silicon MOSFETs: The Next Material Change to Extend Moore's Law, University of Florida, Spring MRS 2004.

Tong et al., A Smarter-cut approach to low temperature silicon layer transfer, Appl. Phys. Lett., 72(1): 49-51 (1998).

Tong et al., Semiconductor Wafer Bonding: Science and Technology, John Wiley & Sons, Inc., pp. 152-171 (1999).

U.S. Dept. of Energy, The Fusion Connection, Plasma Coating. (1985).

Veldkamp et al., Binary Optics, Scientific American, pp. 50-55 (May 1992).

Weldon et al., On the Mechanism of the Hydrogen-Induced Exfoliation of Silicon, J. Vac. Science Tech. B, 15(4), Jul./Aug. 1997.

Wolf et al., Silicon Processing for the VLSI Era vol. 1-Process Technology, pp. 547-549, 1986 by Lattice Press, Sunset Beach, California, ISBN 0-961672-3-7, Reprinted with corrections Jun. 1987.

Wolf et al., Silicon Processing for the VLSI Era vol. 1-Process Technology, p. 139, 1986 by Lattice Press, Sunset Beach, California, ISBN 0-961672-3-7, Reprinted with corrections Jun. 1987.

Wolf, Silicon Processing for the VLSI Era vol. 2, pp. 66-79, Lattice Press (1990).

Wu et al., From Incident Laser Pulse to Residual Stress: A Complete and Self-closed Model for Laser Shock Peening, Feb. 2007. „Journal of Manufacturing Science & Engineering, vol. 129, pp. 117-125.

Wu et al., Two dimensional hydrodynamic simulation of high pressures induced by high power nanosecond laser-matter interactions under water, Journal of Applied Physics, vol. 101, Issue 10, pp. 103514-103514-8 (2007).

Yaguchi et al., Strain Relaxation in MBE-Grown SI1-SGEX/SU (100) Heterostructures by Annealing, Japanese Journal of Applied Physics, Tokyo, JP, v. 30, No. 8B Part 2, Aug. 1991, pp. L1450-L1453.

Yamada et al., Thermal Damage of Silicon Wafer in Thermal Cleaving Process With Pulsed Laser and CW Laser, Laser-based Micropackaging, edited by Friedrich G. Bachmann, Willem Hoving, Yongfeng Lu, Kunihiko Washio, Proc. of SPIE vol. 6107, 61070H, (2006).

Yang et al., High Performance CMOS Fabricated on Hybrid Substrate with Different Crystal Orientations, IEDM Tech. Dig., 2003, pp. 453-456.

Yang et al., On the Integration of CMOS with Hybrid Crystal Orientations, 2004 Symposium on VLSI Technology Digest of Technical Papers, 2004.

Yun et al., Study on the Etching Reaction of Silicon with Carbon Tetrafluoride in Electron Cyclotron Resonance Plasma Etching System, Journal of the Korean Institute of Chemical Engineers, Jun. 1993, pp. 255-262, Hwahak Konghak vol. 32, No. 3.

Zhang et al., Microscale Laser Shock Peening of Thin Films, Part 1: Experiment, Modeling and Simulation, vol. 126, No. 1, Feb. 2004, pp. 10-17.

Zheng et al., Orientation dependence of blistering in H-implanted Si, Department of Electrical and Computer Engineering, University of California, San Diego, La Jolla, California 92093-0407 , J. Appl. Phys. 89, 2972 (2001).

\* cited by examiner

*Figure 3*: Hydrogen Layer Stress Profile Model

| Silicon Film | | |
|---|---:|---|
| Film Thickness | 50 | μm |
| h-Delta | 0 | μm |
| CTE | 2.5 | ppm |

| 1. Moment Loading | | |
|---|---:|---|
| A. External M Load | 0.000 | N-m/m |
| B. Film Displacement | 0.000 | N-m/m |
| Displacement | 0.0 | μm |
| Location from Crack Tip | 5000 | μm |
| M Load Exponent | 0 | |
| (0=Constant M, 1=No Change, 3=Constant displacement) | | |

| 2. H-Layer | | |
|---|---:|---|
| Process Temperature | 700.00 | C |
| Dose | 2.70 | $\times 10^{16}$ cm$^{-2}$ |
| Half-Width | 3.00 | μm |
| Stress Constant (Future) | 1.25E+09 | |
| Stress Temperature | 5091 | C |
| Effective Layer Stress | 2380 | Mpa |

| 3. Top Linear Heat | | |
|---|---:|---|
| Surface Temp | 0.00 | C |
| Zero Crossing | 150.00 | μm |
| M-Factor | 1.00 | |
| P-Factor | 1.00 | |
| (+=on Film, -=on Tile) | | |

| 4. Cleave Bias Temp | 0 | C |
|---|---:|---|
| (+=Tensile, -=Compressive) | | |

| Output | | |
|---|---:|---|
| P (Force) | -3.63E+03 | N/m |
| M (Moment) | 8.72E-02 | N-m/m |
| MIXITY | -2.5929258 | KII/KI |
| Crack Tip Phase Angle | -68.7 | Degrees |
| D1 | 0.318 | J/m2 |
| D2 | 2.1391 | J/m2 |
| Total Energy | 2.457 | J/m2 |

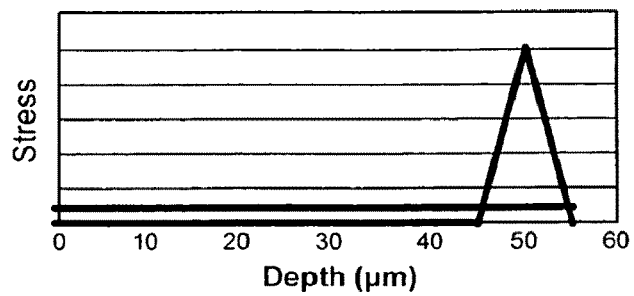

- Dose = 2.7e16
- Stress Constant = 1.25e9

*Figure 3A*

Mechanical Configuration

|  | Film Side* | Substrate Side |
|---|---|---|
| Heat | P+, M+ | P−, M− |
| Cool | P−, M− | P+, M+ |

\* P, M only occurs under specific loading conditions

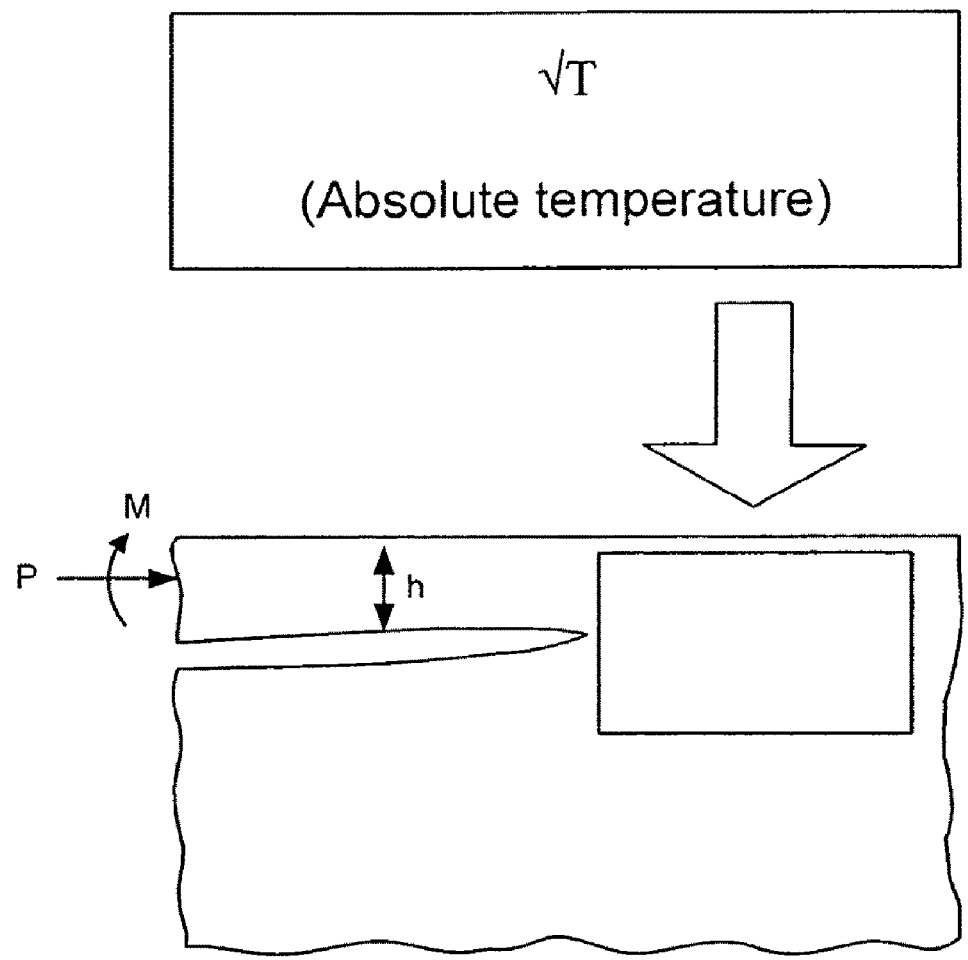
*Figure 6A*: Heat Soak to raise absolute temperature

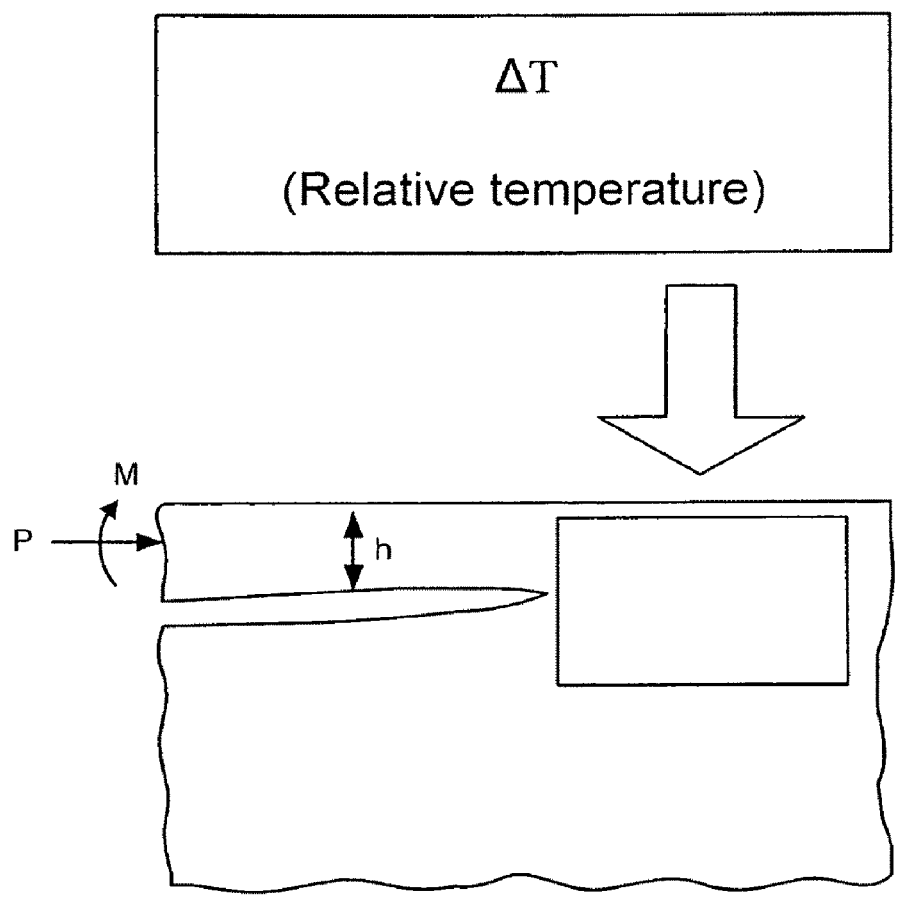
*Figure 6B*: Heat pulse to raise film-substrate temperature differential

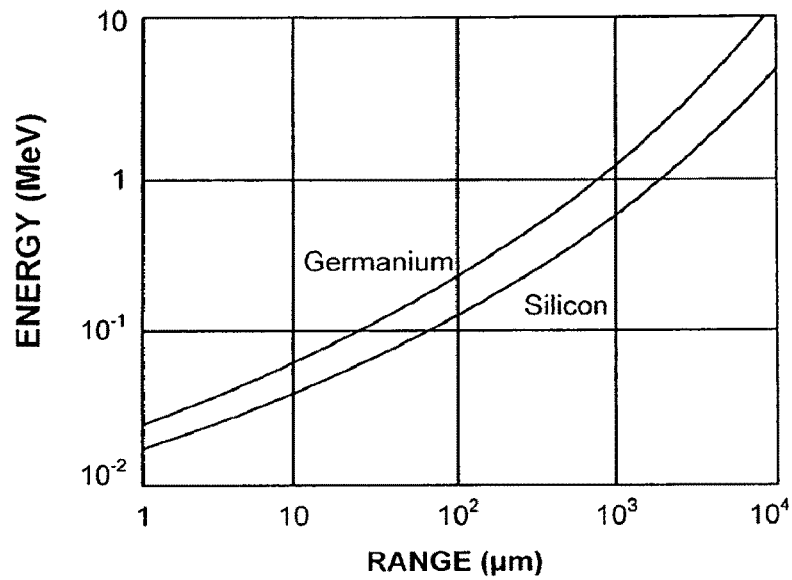
*Figure 7*: Electron range in silicon (CSDA Range)
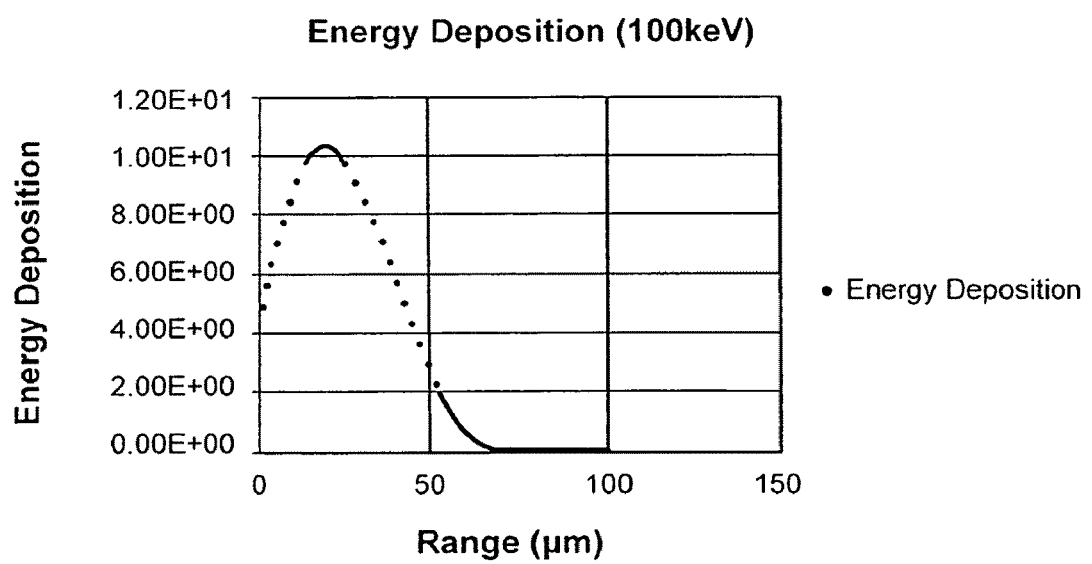
*Figure 8*: Monte Carlo Simulation of E-beam Volumetric Heating Profile in Silicon

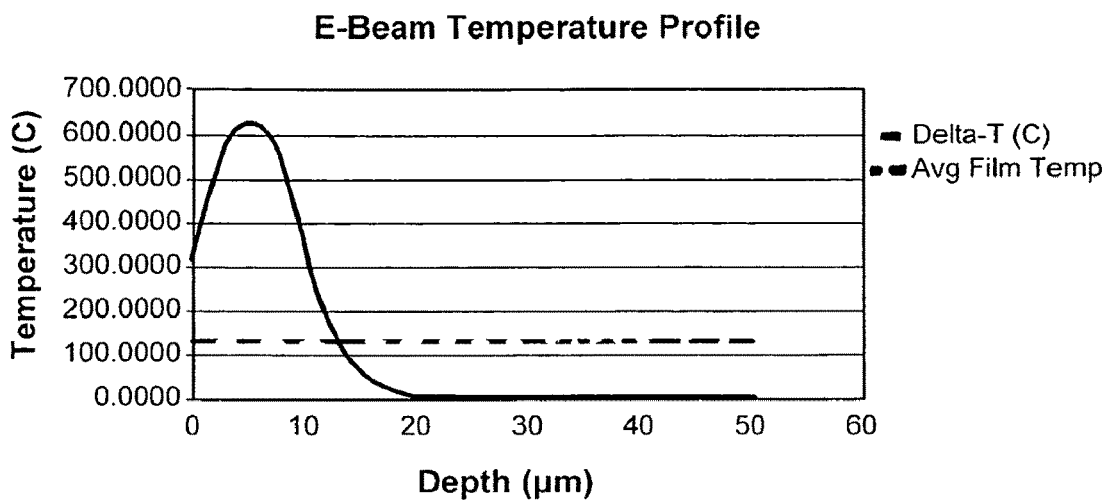
*Figure 9*: Simulated E-Beam Profile to Achieve KII Controlled Propagation Cleaving
| MIXITY | 0.00069722 | KII/KI |
| Crack Tip Phase Angle | 0.0 | Degrees |
| D1 | 2.403 | J/m2 |
| D2 | 0.0000 | J/m2 |
| Total Energy | 2.403 | J/m2 |
*Figure 10*: Stress Intensity and Energy Result Using Adiabatic E-Beam KII Controlled Propagation

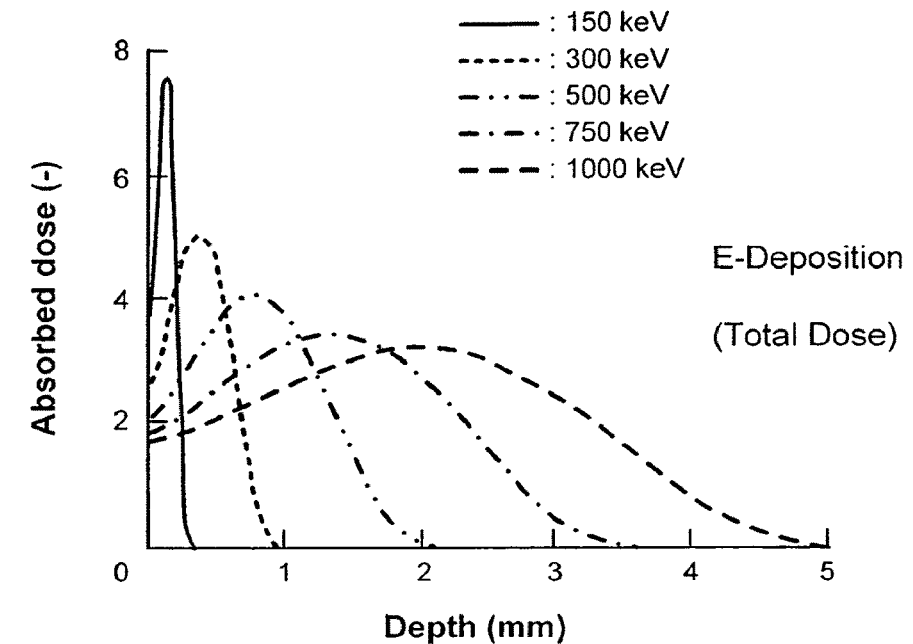
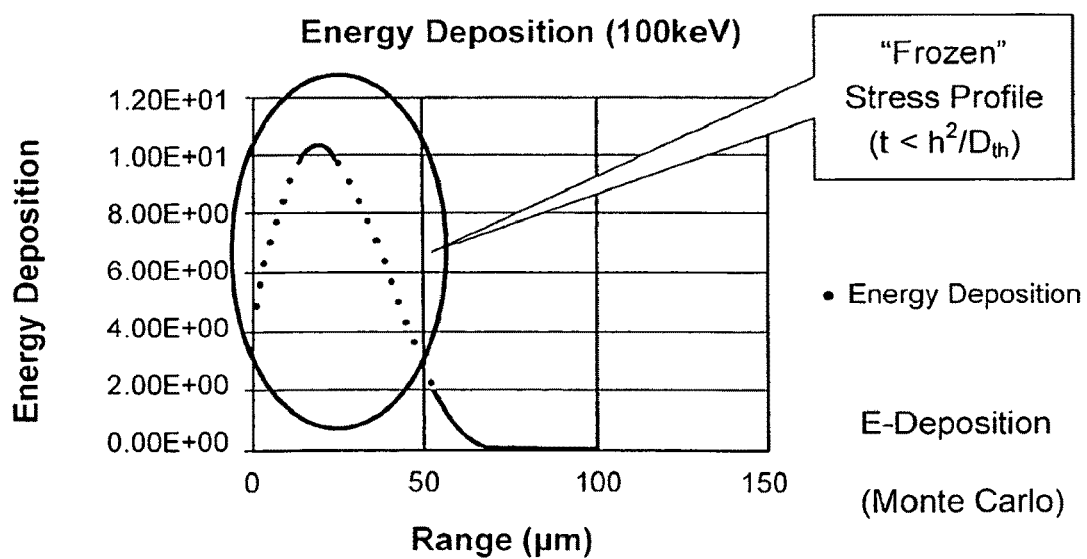
Figure 11

LAYER TRANSFER OF FILMS UTILIZING CONTROLLED PROPAGATION

CROSS-REFERENCE TO RELATED APPLICATION

The instant nonprovisional patent application claims priority to U.S. Provisional Patent Application No. 61/092,683, filed Aug. 28, 2009 and incorporated by reference in its entirety herein for all purposes.

BACKGROUND OF THE INVENTION

From the beginning of time, human beings have relied upon the "sun" to derive almost all useful forms of energy. Such energy comes from petroleum, radiant, wood, and various forms of thermal energy. As merely an example, human beings have relied heavily upon petroleum sources such as coal and gas for much of their needs. Unfortunately, such petroleum sources have become depleted and have lead to other problems. As a replacement, in part, solar energy has been proposed to reduce our reliance on petroleum sources. As merely an example, solar energy can be derived from "solar cells" commonly made of silicon.

The silicon solar cell generates electrical power when exposed to solar radiation from the sun. The radiation interacts with atoms of the silicon and forms electrons and holes that migrate to p-doped and n-doped regions in the silicon body and create voltage differentials and an electric current between the doped regions. Solar cells have been integrated with concentrating elements to improve efficiency. As an example, solar radiation accumulates and focuses using concentrating elements that direct such radiation to one or more portions of active photovoltaic materials. Although effective, these solar cells still have many limitations.

As merely an example, solar cells often rely upon starting materials such as silicon. Such silicon is often made using either polysilicon and/or single crystal silicon materials. Polysilicon material can also, depending on the size of single-crystal grains and degree of crystallinity, called multicrystalline, microcrystalline, or nanocrystalline. These materials will henceforth be called "polysilicon", as opposed to single crystal (monocrystalline) material which does not have numerous random crystal orientations and numerous grain boundaries. Amorphous silicon is not a form of silicon commonly used in wafered solar cells due to its poor carrier lifetime in thicknesses less than a few microns.

The materials for solar cells are often difficult to manufacture. Polysilicon cells are often formed by manufacturing polysilicon plates. Although these plates may be formed in a cost effective manner using crystallization furnaces, they do not possess optimum properties for highly effective solar cells. In particular, polysilicon plates do not exhibit the highest possible efficiency in capturing solar energy and converting the captured solar energy into usable electrical power.

By contrast, single crystal silicon (c-Si) has suitable properties for high grade solar cells. Such single crystal silicon is, however, expensive to manufacture and is also difficult to use for solar applications in an efficient and cost effective manner.

Additionally, both polysilicon and single-crystal silicon materials suffer from material losses during conventional manufacturing single crystal silicon substrates, where a sawing process is used to physically separate thin single crystal silicon layers from a single crystal silicon ingot originally grown. For example, inner diameter (ID) sawing process or wire sawing process eliminates as much as 40% and even up to 60% of the starting material from a cast or grown boule and singulate the material into a wafer form factor. This is a highly inefficient method of preparing thin polysilicon or single-crystal silicon plates for solar cell use.

To overcome drawbacks of using silicon materials, thin-film solar cells have been proposed. Thin film solar cells are often less expensive by using less silicon material or alternative materials but their amorphous or polycrystalline structure are less efficient than the more expensive bulk silicon cells made from single-crystal silicon substrates.

From the above, it is seen that techniques to manufacture suitable high quality single crystal silicon sheets with low cost and high productivity are highly desired.

BRIEF SUMMARY OF THE INVENTION

A film of material may be formed by providing a semiconductor substrate having a surface region and a cleave region located at a predetermined depth beneath the surface region. During a process of cleaving the film from the substrate, shear in the cleave region is carefully controlled. According to certain embodiments, an in-plane shear component (KII) is maintained near zero at a certain film thickness to maintain a propagating cleave plane within the desired depth. In one embodiment, the near-zero KII component is achieved by adiabatic heating of silicon through exposure to E-beam radiation, which can impart thermally generated forces and moments to achieve the desired KII condition. According to other embodiments, the KII component is purposefully maintained at a high level by an implant and optional external energy to guide fracture propagation using an energy control method. In one such embodiment, the high KII component is achieved by heating of the silicon through exposure to radiation such as laser or E-beam, which imparts a thermal gradient to achieve controlled propagation at a precisely defined depth in the silicon through depth dependent cleave energy control.

Embodiments of the present invention relate generally to layer transfer techniques for forming thick films. More particularly, the present invention provides a method and device for low or even implant free layer transfer of thick films for solar cells. Merely by example, it is applied to cleave thick films along a crystallographic plane of single crystal silicon substrate. But it will be recognized that the invention has a wider range of applicability.

Many benefits can be obtained by implementing the present invention. In a preferred embodiment, single crystal silicon ingot substrate with a surface plane in an {111} or {110} crystallographic plane can be selected. Thus, the ion implantation process for creating cleave region can be mostly eliminated or limited to form a cleave initiation region with a portion of peripheral region. This substantially simplifies the layer transfer process, reduces system energy cost and increases productivity.

In certain embodiments, the process is divided into (i) an initiation process utilizing a higher implant dose (the initiation dose) to initiate a fracture in a relatively small area of the silicon ingot substrate (the initiation region), and (ii) a propagation process that extends the initiated crack tip through the remainder of the silicon ingot substrate to release the thick film (the propagation region). Since the propagation process must extend the initiation region through the majority of the surface area of the thick film to be released, this process should operate reliably with a small implant dose, and perhaps without any dose. This is called the propagation dose, and the total dose needed for the process would therefore be the weighted area average of the imitation and propagation dose. For example, if the initiation area is 1% of the total area and utilizes $6\times10^{16}$ cm$^{-2}$ hydrogen while the propagation area utilizes $1\times10^{16}$ cm$^{-2}$ hydrogen, the total effective dose is $0.01*6\times10^{16}$ cm$^{-2}+0.99*1\times10^{16}$ cm$^{-2}$ or $1.05\times10^{16}$ cm$^{-2}$. Reducing or eliminating the propagation dose will have a first order effect on the total dose requirement for this cleaving process.

Lowering of the dose in turn depends on (i) optimizing the effect of the implanted hydrogen to maximize its cleave guiding action and (ii) optimizing the cleave process by generating the right stress intensity conditions at the crack tip to keep the cleave front within the desired depth without breaking or cracking the film. Embodiments in accordance with the present invention are directed to optimizing the mechanical configuration during the cleave propagation process.

In one embodiment, the cleave initiation region can be created in a patterned implantation by irradiating high energy ionic particles with controlled dosage generated using a linear accelerator. In certain embodiments, the present invention provides a mechanical moment loading with a force loading (generated through an appropriate thermal treatment process and/or mechanical forces) to generate a stress gradient such that a substantially zero shear region can be formed despite the natural tendency of the mechanical configuration to generate mixed-mode loading.

Other embodiments use purely thermal loading (either heating alone or in combination with differential cooling) to generate the desired conditions that will control propagation.

Utilizing embodiments of the present invention, a high quality thick film crystalline material having a thickness ranging from a few tens of microns to a few hundreds of microns, can be produced with kerf loss substantially lower than possible utilizing conventional techniques. The resulting single crystal silicon thick films are particularly suited for use in high efficiency (20% or higher) photovoltaic cells. Some embodiments can utilize existing manufacture processing systems and techniques, and take some advantage of certain newly developed techniques for manufacturing thin wafer/substrate for various semiconductor device applications. More details about various embodiments of the present invention can be found in the description below.

BRIEF DESCRIPTION OF THE DRAWINGS

FIG. 3A shows an example of an energy calculator utilizing the model.

FIG. 6A shows the concept of heat soak to raise absolute temperature within the cleave plane area.

FIG. 6B shows the concept of heat pulse to generate a film-substrate temperature differential.

FIG. 7 shows a plot of maximum electron depth versus energy (CSDA Range).

FIG. 8 shows Monte Carlo simulation of E-beam volumetric energy deposition profile in silicon.

FIG. 9 shows a simulated E-Beam profile to achieve KII controlled propagation cleaving.

FIG. 10 shows stress intensity and energy result using adiabatic E-Beam KII controlled propagation.

FIG. 11 shows an energy-stress deposition profile using E-Beam.

DETAILED DESCRIPTION OF THE INVENTION

Figure 1:
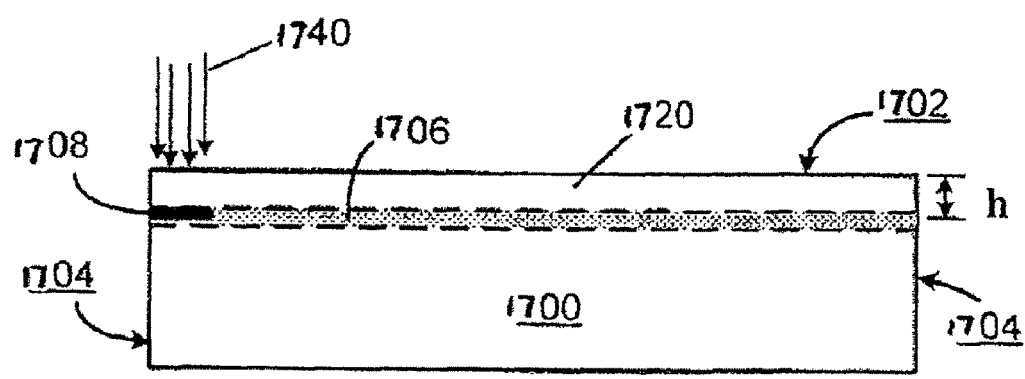
FIG. 1 is a simplified diagram showing a formation of a cleave initiation region by patterned implanting high energy particles according to an embodiment of the present invention.

Particular embodiments of the present invention provide a method and device for layer transfer of thick films for solar cells. Merely by example, it is applied to cleave thick films along a crystallographic plane of single crystal silicon substrate. But it will be recognized that the invention has a wider range of applicability. For example, other materials such as Germanium, Gallium Arsenide (GaAs), Gallium Nitride (GaN), or Silicon Carbide (SiC) could be subjected to the cleaving process to release films of materials for solar, optoelectronic or semiconductor applications.

As discussed in background section, the growth of silicon based solar cells relies on driving down a bottleneck for cost in wafering kerf-loss. Traditional sawing, or adopting recently reported wafering technologies (such as multi-wire saw, spark cutting, laser cutting, or plasma cutting) that render thick films suitable for solar cells, may exhibit limited usefulness due to one or more of the following issues: high kerf loss, slow cutting speed, and lack of manufacturability.

A solution is to use a high energy ion beam to create a cleave region at a desired thickness beneath the substrate surface, then perform a layer transfer process to free the thickness of film from remaining substrate. However, use of only implanted ions to create a cleave region susceptible for cleaving may require a high ion dose and an extended implanting area. Moreover, such reliance upon implanted ions may result in higher surface roughness, added cost with high ion dose and less productivity, and potentially lower yields and film quality. Depending upon the embodiment, these and other limitations are overcome using the present method and structures.

According to particular embodiments of the present invention, cleaving of a film of material may be accomplished with substantially reduced implantation of ions, or possibly no implantation at all, utilizing a cleaving process that carefully controls the shear conditions during the cleaving. In an embodiment, a film of material may be formed by providing a semiconductor substrate having a surface region, a peripheral region, and a cleave region at a predetermined depth beneath the surface region. For purposes of the instant patent application, the term "cleave region" does not necessarily denote a region that has received radiation or implanted ions, but rather refers to a region that may be separated from the substrate following the application of radiation and/or implanted ions.

A cleave initiation region may be defined within a portion of the peripheral region and a vicinity of the cleave region. The cleave initiation region may be formed by subjecting the region to a thermal, chemical, electrical, and/or mechanical process to spall or release a section of the film within the initiation region.

In one embodiment, initiation cleaving is accomplished by subjecting the cleave initiation region to a localized thermal treatment, so that a cleave front can be initiated within this region and propagates to the periphery of the initiation region where the dose is lower and does not promote further propagation. Alternatively, the propagation area is controlled by the localized energy itself. The general film release process can then continue to propagate the initiated film from the existing cleave front through the remainder of the substrate.

FIG. 1 is a simplified diagram illustrating a side view of a semiconductor substrate having a cleave region at a predetermined depth beneath a surface region according to an embodiment of the present invention. This diagram is merely an example, which should not unduly limit the scope of the claims herein. One of ordinary skill in the art would recognize many variations, alternatives, and modifications.

As shown in FIG. 1, a semiconductor substrate 1700 is provided having a surface region 1702 and a peripheral region 1704. In addition, a cleave region 1706 is provided. This cleave region is in essence a virtual plane or layer located at a predetermined depth d beneath the surface region 1702, and is used to define a thickness of thick film 1720 to be detached from the semiconductor substrate 1700. In one embodiment, the semiconductor substrate has a thickness substantially larger than the depth h. In a specific embodiment, the semiconductor substrate is single crystal silicon material for use in a photovoltaic solar cell. In a specific embodiment, the silicon substrate has a surface plane that is generally selected to be close to a $\{111\}$ or $\{110\}$ crystallographic plane (a certain small miscut angle of less than about 1° may exist). In a specific embodiment, the cleave region defined is substantially parallel to the surface region. Since the cleaving action is energetically easier along the $\{111\}$ plane followed by $\{110\}$ plane than in the traditional $\{100\}$ plane, it may be desirable to orient the material to be cleaved to coincide the surface to be cleaved with a lower surface energy crystallographic cleave plane. More detailed description of techniques for selecting certain orientation of the silicon boule for slicing or cleaving can be found in the U.S. Provisional Patent Application No. 61/051,344 filed May 7, 2008 to Francois J. Henley, titled "METHOD AND DEVICE FOR SLICING A SHAPED SILICON INGOT USING LAYER TRANSFER,", commonly assigned, and hereby incorporated by reference herein.

FIG. 1 also shows the formation of a cleave initiation region by pattern implanting high energy particles according to an embodiment of the present invention. This diagram is merely an example, which should not unduly limit the scope of the claims herein. One of ordinary skill in the art would recognize many variations, alternatives, and modifications.

As shown in FIG. 1, a portion of the peripheral region 1704 can be associated with a predetermined patterned region (not shown directly in the cross-sectional view of FIG. 1) within the surface region 1702. In one embodiment, the selected portion of the peripheral region is within an edge vicinity of the cleave region 1706.

Then the patterned region of the surface region 1702 is exposed to a high energy ion beam 1740, for example H+ ions with energy level of 1 MeV or more using a high-energy particle accelerator. The choice of accelerators can range from linear accelerators (electrostatic or RF driven types) or other non-linac types such as cyclotron accelerators.

Ion implant apparatuses useful for embodiments of the present invention have been made recently available by the use of DC electrostatic particle accelerators such as the DYNAMITRON proton accelerator available from Ion Beam Applications SA, Belgium). Other forms of DC electrostatic accelerators which may be used include Van de Graaff or Tandem Van de Graaff accelerator types.

Still other forms of particle accelerators suitable for use in accordance with embodiments of the present invention may include radio frequency (RF) particle accelerators such as a cyclotron or a RF linear accelerator (RF Linac). Examples of possible particle accelerator types include radio-frequency quadrupole linear accelerator (RFQ-Linac) or Drift-Tube Linac (DTL), or RF (Radio)-Focused Interdigitated (RFI) technology. These are available from companies such as Accsys Technology Inc. of Pleasanton, Calif., Linac Systems, LLC of Albuquerque, N. Mex. 87109, and others.

Since a patterned implant is desirable, scanning of a particle beam of a limited beam size is preferred. The scanning can be electromagnetic, electrostatic, or mechanical depending on thermal, mechanical, cost and other considerations. In one embodiment, the area of the patterned initiation region is limited to 1-3% of the total substrate surface area (e.g., 2-5 $cm^2$ or less for a 125 mm×125 mm sized substrate), so that the ion particle dose is well controlled minimize energy costs of the system and enhance productivity of the thick film cleaving process.

The high energy ions are implanted beneath the surface region to reach a region within the vicinity of the cleave region 1706. The penetration depth of the ions is dependent on the energy level, and can be controlled to a desired value that determines a depth h of the cleave region. The implanted ions slow down within the crystal lattice by transferring kinetic energy to the lattice in the form of ionization (electronic braking), and small amount of atomic damage by displacing atoms (nuclear stopping).

During the final phase (within about 2-5% of the total range), the ions interact substantially more with the crystal lattice under nuclear stopping, and a thin region of relatively high stress and damaged lattice bonds is formed to define a cleave initiation region 1708. As shown, the formed cleave initiation region 1708 is a small planar region extending from a portion of the peripheral region 1704 toward within the cleave region 1706. Since the patterned implantation is performed by irradiating ionic particles within an area less than 1-3% of total area of surface region, this initiation dose can be higher than the propagation dose. This allows the averaged area dose to be maintained low for enhanced productivity. Of course, there can be many alternatives, variations, and modifications.

Controlled Propagation Methods

Aspects of controlled propagation are described in U.S. Nonprovisional patent application Ser. No. 12/435,230, filed May 4, 2009 and incorporated by reference in its entirety herein for all purposes. Certain embodiments of the present invention seek to modify the cleaving configuration to reduce, eliminate, or control the shear mode II stress intensity factor (KII) at the tip of a propagating cleaving fracture. When the cleaving action proceeds reliably along a desired depth under surface 1702, the process will be generally referred to as controlled propagation.

Two forms of controlled propagation can be utilized to reliably propagate a cleave within material 1700 to release a film of thickness h from the substrate and avoid cleave failure. The first form of controlled propagation is referred to as "KII controlled propagation", while the second form of controlled propagation is referred to as "energy controlled propagation". Both forms can control the propagating cleave plane at a desired depth to release a film of thickness h. However, these forms of controlled propagation accomplish this goal utilizing different methods and approaches.

A key consideration in designing cleaving approaches is the avoidance of unwanted cleave failure where the film is cracked or broken. Cleave failure is essentially defined as the unwanted branching of the cleave plane, usually resulting in fractured films. Avoidance of unwanted branching of the cleave plane is thus a consideration in the design of cleaving techniques. Other factors found to affect unwanted branching include crystal orientation and implant dose and depth and temperature profile, for example.

Other effects have been found to be important. For example, for single-crystal silicon, thermal energy injected within the vicinity of the cleave plane and used to generate cleaving stresses will be affected by the fact that the implanted cleave plane has a substantially lower thermal conductivity over unimplanted single-crystal silicon. This lower thermal conductivity is a result of the hydrogen implant damage and will tend to modify the temperature profile, which in turn will modify the cleaving stresses.

KII Controlled Propagation

A first form of controlled propagation is KII controlled propagation, and is defined as simultaneously achieving threshold cleave propagation energy G' (defined below) with KII at or near zero. Based on a basic principle of Linear Elastic Fracture Mechanics (LEFM) where a propagating cleave front changes direction so as to achieve and maintain KII=0, this condition will allow the propagating cleave plane to stay at the desired depth. Stable KII control occurs when small changes in depth generate a restoring KII shear of the level and sign so as to help turn the cleave plane towards the desired depth.

While the condition KII=0 is usually considered an ideal condition for achieving stable cleave propagation, there is a certain range of KII within which the cleaving will follow a crystallographic cleave plane. Thus, where conditions allow for maintenance of KII within a limited range around zero, the cleaving action can desirably continue to follow a cleave plane.

Energy Controlled Propagation

A second form of controlled propagation is energy controlled propagation, and is characterized as a depth control where the threshold energy required to propagate the cleave plane changes such that below the desired depth, propagation is favored by a high KII factor but energetically cannot be supported. Cleaving by an implanted hydrogen layer is one example of energy controlled cleaving.

In the case of pure cleaving by a hydrogen cleave plane, propagation will stop if cleaving progresses away from the implanted depth, since deviation of the cleave plane towards the surface will reduce the energy available for propagation. As a result, the strong tendency to propagate towards the surface is cancelled by the strong energy-depth dependence.

Derivation of Controlled Propagation Equations

The following discussion address general Linear Elastic Fracture Mechanics (LEFM) equations that may govern cleaving according to embodiments of the present invention. This analysis assumes a large-area tile, where the film is much thinner than the remainder of the silicon tile.

Figure 2:
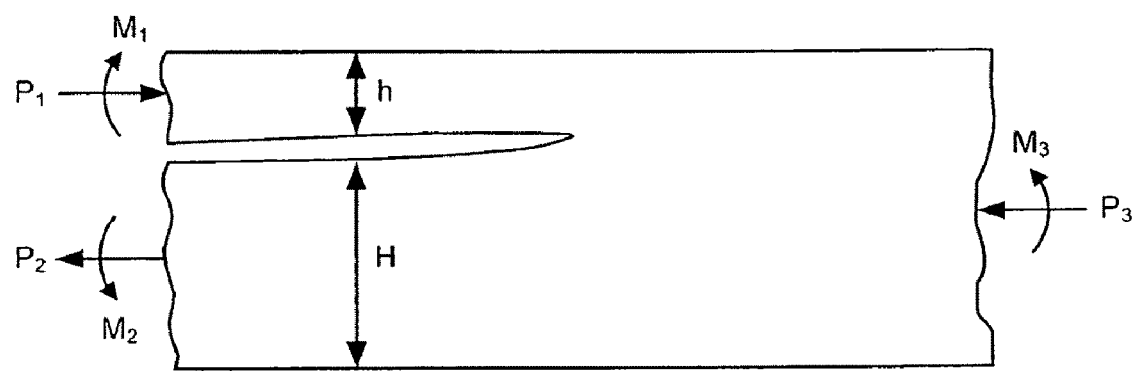
FIG. 2 shows a simplified schematic view of the general case of propagation.

The mechanical configuration following the initiation process is shown in FIG. 2. Specifically, a thick film of thickness h is partially released from the rest of the silicon ingot substrate having thickness H. Due to the much larger dimensions of the substrate relative to the cleaved material, h<<H and the tile moment and forces $M_2$, $P_2$ and $M_3$, $P_3$ are understood to be very small. The source of stress intensity seen at the crack tip is thus dominated by $M_1$ and $P_1$, the moment and force coupled to the partially released thick film.

A basic concept of embodiments of the present invention is the hydrogen cleave plane. The hydrogen cleave plane (H-plane) affects the cleaving action through stress and layer weakening effects. Specifically, the H-plane can be used both as an initiating layer at higher doses, and as a guiding or propagating layer when the dose is lower. The action of the H-layer is different within these two dosage regimes.

One effect upon cleaving action of the end-of-range (EOR) hydrogen implant layer, is the reduction in fracture strength around the cleave plane. Such reduction in fracture strength can be caused by bond damage and by stress induced by the presence of the hydrogen itself. Both of these considerations can lower the energy needed to create a new surface during cleaving.

The energy needed to create a new surface during cleaving, is hereafter referred to as the surface energy ($\gamma$). In unimplanted single crystal silicon, the surface energy is about 1.2 J/m² for the {111} orientation, although fracture toughness in silicon is sometimes reported as 4-6 J/m² and includes effects such as lattice trapping to give an effective energy to produce a new surface. For the following analysis of silicon at {111} orientation, a surface energy of 1.2 J/m² per surface (2.4 J/m² total) will be assumed.

By contrast, the value of the modified surface energy ($\gamma'$) along an implanted cleave plane can be substantially lower, perhaps by a factor of 5 or more. The surface energy value $\gamma'$ of the effective cleave plane is related to the unimplanted surface energy ($\gamma$) according to the following relation:

$$\gamma' = \alpha_H^2 * \gamma \qquad (1)$$

where $\alpha_H$ is a factor between 0 and 1 that serves to quantify the reduction in cleave energy due to hydrogen embrittlement. The $\alpha_H$ term accounts for all of the effects necessary to yield an accurate representation of all of the stress and bond damage effects. $\alpha_H$ is experimentally determined as a function of cleave energy, dose, implant thermal conditions, and post-implant thermal conditions.

Since the cleaving energy is a fundamental parameter in linear elastic fracture mechanics, the correlation between implant dose and energy allow accurate prediction and modeling of cleaving action.

Two surfaces are created during the cleaving process. Thus the cleave energy release rate (G') is related to the surface energy as follows:

$$G' = 2 * \gamma' = 2 * \alpha_H^2 * \gamma \qquad (2)$$

Depending on the embrittlement factor ($\alpha_H$), G' can change from about 2.4 J/m to substantially less within the cleave plane. For example, in an experiment involving a 50 μm thick single crystal silicon film, a crack in a cleave plane formed by a H implantation dose of 2-8×10¹⁶ cm⁻² showed that for H-doses higher than about 4-6×10¹⁶ cm⁻², there is a measurable lowering of the cleave energy ($\alpha_H^2 < 1$) as measured by a double-cantilever beam mechanical configuration.

For cleave planes with lower hydrogen doses (less than about 4×10¹⁶ cm⁻²), it has been experimentally determined that $\alpha H^2 \sim 1$. With the cleave energy essentially having intrinsic cleave energy values, cleave guiding at lower doses is thus mostly dominated by the implanted hydrogen compressive stress profile that helps keep the cleave front propagating along the cleave plane by the principle of energy control.

A series of closed-form equations have been developed to investigate cleaving behavior. Development of these equations assumes that a starter crack resulting from cleave initiation, is present at a depth of (h) into the substrate, thereby defining the thickness of the cleaved film. In many of the examples, h=50 μm, but any film thickness is allowed in the equations. The models assume a detached film length (named c or sometimes L) of a few millimeters to a few centimeters. The geometry is two-dimensional, meaning that the width w does not change as the cleaving occurs along a line.

The crack opening force mode (KI), and the in-plane shear force mode (KII), are important parameters for modeling the cleaving process. It would be expected that the resultant conditions leading to crack extension and propagation would match silicon or any other material if the known fracture energy for that cleaving configuration is utilized. For example, the fracture condition is known to occur in single crystal silicon when G' exceeds 2*$\gamma'$, about 2.4 J/m² for an unimplanted layer.

The threshold for fracture propagation is defined as follows:

$$G = \frac{1}{E_1}(K_I^2 + K_{II}^2) \quad (3)$$

where E'=the plane strain equation defined as E'=E/(1−v²), and, for all purposes of this document, G is G' and generally related to the cleave plane by equation (2):

$$G' = 2*\gamma' = 2*\alpha_H^{2}*\gamma \quad (2)$$

FIG. 2 shows the general case of the propagation problem assuming isotropic, homogeneous, and linearly elastic material. A pre-existing crack is subjected, uniformly along three edges, to axial forces and moments. Using equation (2) and solving for the general solution for the stress intensity factors yields the following solution for the crack tip energy release rate:

$$G' = \frac{1}{2E}\left[\frac{P_1^2}{h} + 12\frac{M_1^2}{h^3} + \frac{P_2^2}{H} + 12\frac{M_2^2}{H^3} - \frac{P_3^2}{h+H} - 12\frac{M_3^2}{(h+H)^3}\right] \quad (4)$$

Where $P_n$ and $M_n$ are the forces and moments respectively, acting on each of the members.

The KI and KII factors then take the form:

$$K_I = \frac{P}{\sqrt{2hU}}\cos\omega + \frac{M}{\sqrt{2h^3 V}}\sin(\omega+\gamma), \quad (5,6)$$

$$K_{II} = \frac{P}{\sqrt{2hU}}\sin\omega - \frac{M}{\sqrt{2h^3 V}}\cos(\omega+\gamma).$$

where the parameters are derived from the forces, moments and geometry as described in detail by Hutchinson and Suo, "Mixed Mode Cracking in Layered Materials", Advances in Applied Mechanics, Vol. 29 (1992), which is incorporated by reference in its entirety herein for all purposes.

If the thickness of the remaining substrate (H) is assumed to be very large compared to the film thickness (h), the above equations (5, 6) can be simplified and collapsed into equations (7, 8) by the following:
γ (angle)=0
P=P1
M=M1
U=1
V=1/12
ω=52.07 degrees
η=h/H~0
All C constants are zero $$K_I = \frac{1}{\sqrt{2}}\left[Ph^{-1/2}\cos\omega + 2\sqrt{3}\,Mh^{-3/2}\sin\omega\right], \quad (7,8)$$

$$K_{II} = \frac{1}{\sqrt{2}}\left[Ph^{-1/2}\sin\omega - 2\sqrt{3}\,Mh^{-3/2}\cos\omega\right],$$

Equations (7, 8) will be used to derive the various configurations of the cleaving approaches. The only change in the equation based on the configuration is to include the appropriate force (P) and moment (M) relationships for the particular loading conditions.

Hydrogen Cleave Plane Model

Figure 3:
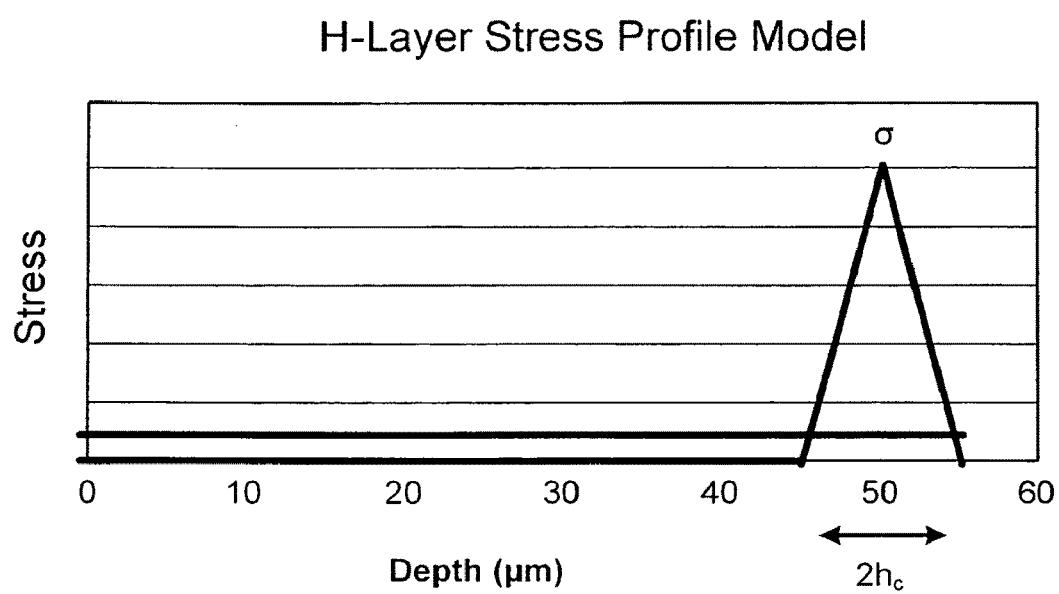
FIG. 3 shows hydrogen layer stress profile model.

The hydrogen cleave plane has been found to be reasonably well modeled using a triangular stress distribution centered at depth h and having a peak stress σ with linearly decreasing stress to zero at h+/−$h_c$. FIG. 3 shows the profile with h=50 um and $h_c$=5 um. FIG. 3A shows an example of an energy calculator utilizing the model.

The M and P function are:

$$P = -\sigma h_{c/2}$$

$$M = +\sigma(hh_c/4 - h_c^2/6)$$

The KI and KII functions (with small cross-terms ignored) is:

$$K_I \sim \frac{0.265\sigma h_c}{\sqrt{h}} \quad (9,10)$$

$$K_{II} \sim \frac{-0.65\sigma h_c}{\sqrt{h}}$$

These equations show that the stress intensity mixity is about −2.45 and tends to propagate the cleave plane towards the surface. As this occurs, however, the stress factor falls quickly below the threshold energy required to support propagation.

In "Hydrogen-Induced Silicon Wafer Splitting", J. App. Phys., Vol. 94, No. 3, pp. 1454 (2003), F. Yang developed a hydrogen cleave plane theory where the hydrogen develops a pressure proportional to the root of dose and temperature. This article is incorporated by reference in its entirety herein for all purposes.

According to this theory, a phenomenological stress function can be written as:

$$\sigma = \text{sqrt}(kT\phi)*\alpha_H*K_0 \quad (11)$$

where $$K_0 = \frac{3E'h}{4*0.4927*h_c},$$

where
kT=Boltzmann's constant*absolute cleave plane temperature; and
φ=Hydrogen dose The Equations 8-11 show depth independence of the stress intensity factor when the ratio $h/h_c$ is recognized as being constant through the cleave depths of interest, or about 20-150 um for hydrogen implantation in silicon.

General External Energy Model

LEFM allows the superposition of external energy to an existing hydrogen cleave plane by adding the KI and KII stress intensity functions as follows:

$$K_I \sim \frac{-0.65\sigma h_c}{\sqrt{h}} + \frac{1}{\sqrt{2}}\left[Ph^{-1/2}\cos\omega - 2\sqrt{3}\,Mh^{-3/2}\sin\omega\right] \quad (12,13)$$

$$K_{II} \sim \frac{-0.65\sigma h_c}{\sqrt{h}} + \frac{1}{\sqrt{2}}\left[Ph^{-1/2}\sin\omega - 2\sqrt{3}\,Mh^{-3/2}\cos\omega\right]$$

where the cleave plane is located within a hydrogen cleave plane of peak stress σ and characteristic width $h_c$, and has external energy added to the system in the form of a force P and moment M. These serve to modify the cleave energy and stress intensity.

Solutions to the above general cleave propagation equations (12, 13) utilizing the energy and KII control propagation approaches, are derived in the next sections. In all cases, the stress intensity equations (12, 13) are solved with the cleave energy threshold equations (2, 3) to yield the energy & cleave direction condition.

Coordinate System Used in the Models

To quantify the various configurations, a coordinate system was defined with the cleave plane along the X direction (positive X to the right), the thickness of the film along the Y-direction (positive in the up direction), and the Z direction is positive out of the surface. This coordinate system is used in the Finite Element Analysis (FEA) code. Software available from Ansys, Inc. of Canonsburg, Pa. (hereafter the AnSys software) was used to model the crack propagation system and included thermal and mechanical parts that interacted with a cohesive zone model (CZM) of the interface. The CZM code allowed the determination of conditions under which the applied stresses and moments would propagate the fracture.

The configuration of FIG. 2, where the detached, initiated film is to the left, was entered into the AnSys software. The results are summarized in the following sections and show the KII cancellation action resulting from different loading (P and M) configurations.

The AnSys software was also used to extract the Mode I (crack opening) and Mode II (in-plane shear) cleave energies, designated herein D1 and D2 respectively. Specifically, these cleave energies are extracted at the time of CZM debonding (cleaving). This extracted data can show the efficacy of the energy and KII controlled propagation approaches.

To test the AnSys software, displacement and shear cleaving loads were used to compare with the closed form solutions of M-only and P-only cleave configurations. In all models, the cleave energy is 2.4 J/m$^2$, Young's Modulus is 187 GPa, the thermal expansion coefficient ($\alpha_{CTE}$) is 2.5 ppm, and Poisson's Ratio is 0.272.

External Energy Configurations

The general configurations leading to the application of M and P that can propagate the cleave front through the desired thickness is a complex mixture of chemical, physical, thermal and mechanical elements. These can be summarized as follows.

A. Mechanical Forces and Moments

Mechanically induced forces and/or moments on the film can add to the cleave energy and assist or allow controlled propagation. Due to the limited thickness of the film and its relative fragility, mechanical energy inputs are preferably positive moments in the form of bending of the film in a controlled manner.

Moment Application Conditions

The moment applied to the film was a bending of the film away from the rest of the substrate. Such bending will generate KI and KII conditions that tend to break the film. If a pure moment (P=0) is used, the KI and KII will change depending on the moment value, but will have a constant ratio (KII/KI) of $-\cos(\omega)/\sin(\omega)$ or $-0.78$ since $\omega$ is unchanging with a value of 52.07 degrees. This ratio is defined as the mixity of the stress intensity, and its value determines the tendency for the propagating front to change in thickness (the Y-direction). The moment application is therefore negative in mixity (snapping the film), and proportional to the bending of the film as experienced by the crack tip.

There are stable, metastable, and unstable methods of applying moments to a film. The major configurations are summarized below.

Constant Displacement Loading

A constant displacement applied to a film at a certain distance away from the crack tip is considered a stable loading configuration, since any crack extension will reduce the applied moment. The displacement is increased to reload the crack tip and the propagation process can resume. A blade or other means of developing a fixed distance in both X and Y at a point beneath the pre-cleaved film would develop a constant displacement load.

Constant Force Loading:

A constant force applied to a film at a certain distance away from the crack tip is considered an unstable loading configuration since any crack extension will increase the applied moment. This will usually result in uncontrolled crack extension and thus is not a preferred loading configuration.

Constant Moment Loading

A constant moment loading on a film can be developed using certain configurations as described here. One advantage of this configuration is the ability of the system to stay to a desired moment loading without active assistance. If a crack extension occurs with an application of a second load, for example, the system will continue being loaded with the same moment. This configuration is to be avoided if the moment is chosen to exceed the fracture strength of the material, since uncontrolled crack extension can occur.

The film bending moment can be applied either statically or quasi-statically or in a dynamic manner such as exciting the film ultrasonically in resonance or out of resonance. In all cases, the moment loading M imparted to the crack tip, according to certain embodiments of this invention, is designed to increase the KI and KII stress intensity factors using ultrasonic motion, displacements, and forces to a design point to allow controlled crack propagation along a desired cleave plane.

If the guiding of the cleave plane is sufficient (high $\Delta_{KII-}$ and $\Delta_{KII+}$), then there would be no reason to add P to the configuration and a threshold crack extension along the desired cleave plane is possible. This would occur if the $\Delta_{KII-}$ and $\Delta_{KII+}$ are sufficiently high to counter the inherent KII/KI mixity of $-0.78$ of this moment loading configuration. This does not occur naturally in silicon but with an optimized cleave plane, this may be a sufficient loading configuration to accomplish film detachment.

B. H-Layer Cleave Layer

The presence of an implanter layer serving to drive and guide a propagating cleave front is another element of a successful cleave configuration. The use of a low-dose cleave layer in addition to external energy (mechanical, thermal, etc.) can be simulated using equations (12, 13) to yield a stable, desired cleave condition. As the equations show, the compressive cleave layer imparts a negative force ($-P$) and positive moment ($+M$) to the equations to accomplish energy controlled propagation cleaving or, with appropriate external M,P inputs are applied, KII controlled propagation can also be generated.

C. External Thermal Energy

Figure 4:
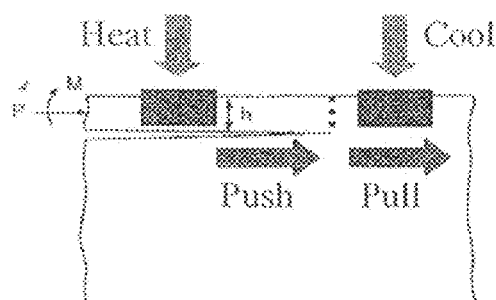
FIG. 4 shows a simplified matrix of available thermal loading configurations.

The use of external thermal input energy can generate a rich variety of M and P inputs to equations 12 and 13. FIG. 4 shows the heating and cooling matrix that can be used as a general guide to select the appropriate thermal energy placement and type. This matrix assumes surface cooling or heating and thus is only partially complete. For example, volumetric heating on the substrate side below h/2 would reverse the moment to M+.

The thermal energy can be predominantly P loading by the use of a constant thermal temperature across the film to a thermal M & P loading to achieve KII cancellation. These will be further developed in the next sections.

The time element of the loading is important. For example, film cooling and heating must occur within a certain time period to develop significant P loading. Using the film as part of the thermal loading configuration is thus only effective under certain conditions.

Figure 5:
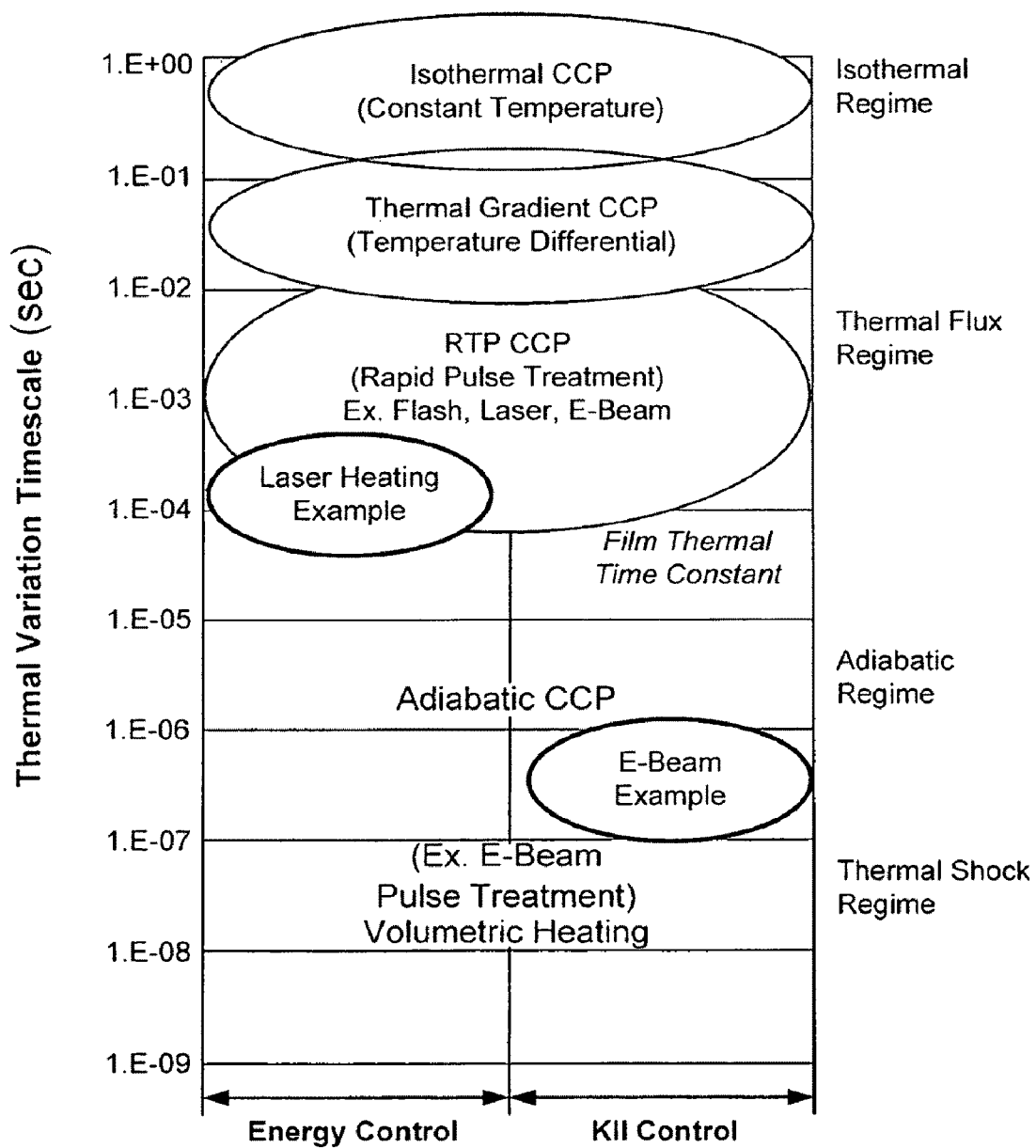
FIG. 5 shows a graph of the cleaving regimes available as a function of time scale of thermal loading application.

FIG. 5 shows the time scale of the thermal treatments with two loading examples denoted within the graph. The first is a surface substrate heating method that adds to a pre-existing implanted cleave layer to achieve stable cleave propagation through energy control. In this example, a laser heating source is described but other surface and sub-surface heating sources may be equally effective.

The second loading example is use of an E-Beam pulsed volumetric heating source that can adiabatically heat the film side close to the cleave front, so as to generate a M & P loading to achieve KII controlled propagation. This method can utilize an implanted layer but may also impart cleave depth control without any propagation implant dose.

Cleave Configurations Leading to Energy Controlled Propagation

The general equations 12 and 13 show that the hydrogen cleave plane can act as an energy barrier to keep the propagation within the desired depth. If a changing propagating dose is used, the cleave depth will tend to change to maintain the cleave threshold energy condition. With a lower propagating dose for example, the cleave depth will tend to increase so as to harvest more of the implanted stress layer. This can only work to the point where the cleave plane is $h+h_c$, and if the integrated stress over the film P should fall below the threshold energy cleave condition, cleaving can no longer occur. An external M and P can inject enough energy to continue propagation and would tend to lower the cleave depth. If the implant dose is too small, its depth control function will be lost and uncontrolled cracking may occur. It is therefore an important consideration that a sufficiently high dose of hydrogen be present to act as a depth control layer, if reliable energy controlled propagation cleaving is used.

Hydrogen-only cleaving (50 um cleave depth) has been experimentally verified at about $2.5 \times 10^{16}$ cm$^{-2}$ at 650-700° C. cleave temperature.

The conditions for thermally induced film stress, combine into the KI and KII equations as follows:

$$M=0 \text{ and } P=-\sigma_{th}*h.$$

Recognizing that a thermal stress function of magnitude $\alpha_{CTE} E \Delta T$ is developed by a temperature change in a material with a coefficient of thermal expansion $\alpha_{CTE}$, the equation becomes, $$P=-\alpha_{CTE} E h \Delta T \qquad (14)$$

Where $\Delta T$ is the temperature difference between the film being subjected to thermal treatment and connected material.

Substituting into equations (12,13):

$$K_I \sim \frac{0.265 \sigma h_c}{\sqrt{h}} - \frac{\alpha_{CTE} E \Delta T \sqrt{h} \cos\omega}{\sqrt{2}} \qquad (15, 16)$$

$$K_{II} \sim \frac{-0.65 \sigma h_c}{\sqrt{h}} - \frac{\alpha_{CTE} E \Delta T \sqrt{h} \sin\omega}{\sqrt{2}}$$

where $\Delta T$ is the temperature difference imparted by the material above the cleave front and the rest of the substrate. Since the heating source adds to KII, this is predominantly KII shear cleaving.

Since the first term is proportional to absolute temperature while the second term is proportional to a temperature difference, a heat soak followed by a dynamic heating pulse can generate a tuned temperature profile to optimize the cleaving conditions. For example, a lower propagating cleave dose can be as effective if a higher absolute cleave plane temperature is used. A temperature difference can then be superimposed.

This two-step process can be readily accomplished by varying the heating source's time-intensity profile. For a 50 um silicon film for example, the film thermal time constant is about 30-40 usec.

A heat soak would occur with heating in the hundreds of microseconds to millisecond range while the heat pulse $\Delta T$ can be efficiently generated with a higher intensity heating on the few tens of microsecond time scale. For example, a 500° C. absolute temperature could be generated using a millisecond laser beam heat treatment along with a 100-300° C. film-substrate temperature differential to satisfy the threshold temperature condition.

The thermal soak/pulse approach could take place where the substrate is stationary relative to the applied external energy. In other embodiments, the substrate or the applied energy could be moved relative to one another. In one embodiment, a single source of applied energy could have intensity varied over time to accomplish the soaking and pulsing. According to another embodiment, multiple sources of applied energy could be scanned, with one source raising the absolute temperature (soak) and a second source creating the temperature differential (pulse).

FIGS. 6A and 6B show the 2-step thermal soak/pulse process as a thermal beam impinging on the substrate surface just ahead of the cleave front. Any heating of the as-cleaved film would simply expand the film unless shock waves are used (see next section).

Cleave Configurations Leading to KII Controlled Propagation

The general equations 7 and 8 show that forces and moments imparted to the film will generate KI and KII stress intensity factors at the crack tip as described in the equations. The film force P is the force per unit width imparted to the film, and is related to film stress at the crack tip area as $P=\sigma*h$. The moment is the moment impressed onto the film that generates M at the crack tip.

That the M and P relation is additive in equation 7 but subtractive in equation 8, suggests that application of P and M can add in KI while subtracting in KII. Therefore, if the moment M and film force P are chosen correctly, the condition of simultaneously achieving crack extension while KII is cancelled (zero) would assure that the propagating crack has the greatest tendency to propagate along the cleave plane. This optimized set of conditions would allow low or zero dose cleave plane operation, and even allow controlled depth guiding through active control of M and P as a function of the actual cleave depth achieved during crack extension. Such reduced or no dose conditions, and control over the depth of cleaving are among the significant benefits achieved according to embodiments of the present invention.

Cleaving Utilizing Thermal Shock (Dynamic Cleaving)

According to certain embodiments, cleaving may be achieved through the action of stress within the film layer caused by rapid thermal differences. In particular, exposure of the substrate to a cooling (cold shock) or a heating shock may result in cleaving of the film. Alternatively, shock heating of the film behind the crack tip will generate the stresses necessary to advance the crack under certain conditions. Both P-loading configurations are summarized in greater detail later in this section.

The thermal only cleave energy equation (no H-cleave plane) can be derived by solving equations (2, 3) (7, 8) with M=0 and P as defined in equation (14):

$$G'=2*\gamma'=\tfrac{1}{2}*\alpha_{CTE}^2*E*h*\Delta T^2*(1-\nu^2) \quad (17)$$

According to certain embodiments of the present invention, the action of the positive thermal KII and the negative moment KII can be combined, to yield a cleave propagation technique that allows simultaneous achievement of the conditions of $G'=2*\gamma'$ (or any appropriate threshold cleave energy condition) and KII=0.

Thermal Heating Shock Cleaving

A heating shock can be applied on the film behind the crack tip if it is developed fast enough to impart an inertial force onto the cleave front. To allow the thermal shock to efficiently develop P in this configuration, the thermal application develops the shock wave before there is a mechanical relaxation of the expansion through movement of the film away from the crack tip area.

In contrast with the prior film-substrate heating configuration where the thermal application time is linked to the thermal time constant of the film, the film heating configuration is applied on a time scale on the same order as the acoustic time constant of the film material. The rapid heating is therefore applied in a very short time interval on the range of sub 100 nanoseconds to a few microseconds, depending on the width of the heat shock and its proximity to the crack tip.

To achieve the threshold crack propagation condition ($\Delta T=183°$ C.), for example on 50 um silicon within 250 nsec, a power density of over 6 MW/cm$^2$ is required. This is a very high power density that is within the adiabatic heating regime of silicon.

To avoid generating heating stresses along the depth of the silicon film that can lead to damage in the form of pits, surface melting, film breakage and cracking, volumetric heating is preferable over surface heating. Electron beam (E-Beam) heating is a good candidate technology to apply to this heating, as it can volumetrically heat a portion of the film (cleaved or uncleaved). FIG. 11 shows an energy-stress deposition profile using E-Beam.

E-beams are also highly controllable with the following general characteristics. E-Beams allow beam scanning over a large area with high controllability and speed. E-Beams allow fine control over beam intensity and diameter (micron to centimeter size). E-Beams allow control over pulsing from nanoseconds to CW. E-beams allow control over heating depth by changing electron beam energy (keV to MeV). As shown in FIG. 7, these electron beam energies correspond to beam penetration ranges of from a few microns to a few centimeters.

The power flux of the beam is therefore easily controlled by selecting the beam diameter, beam energy, and beam intensity, while the penetration range is selected by the beam energy. For example, 50 um electron beam penetration in silicon is about 80 keV and a 0.5 mm beam diameter would require a 200 mA beam intensity pulse for 250 nsec. Alternatively, a pulsed beam treatment could be made with a CW beam scanned sufficiently rapidly. For the example above, the required beam scan velocity would be 0.5 mm/250 nsec or 200,000 cm/sec.

Most if not all of the above characteristics can be available in present system built for precision vacuum welding and material modification applications. For example, e-beam systems from Pavac Industries, Inc. (Richmond, B.C. Canada, www.pavac.com) and others could be used as an adiabatic heating source.

E-beams could control the propagation of the crack tip under KII canceling configurations. E-beam technology can also be used for initiating a first area of film as well as possibly cleaving under pure shear conditions. These approaches are described below.

Control of Cleave Depth Using KII Canceling

Maintaining precise control over film thickness is important not only for achieving highly uniform films, but also to avoid cleave failures. The KII canceling scheme offers the inherent ability to control the propagating cleave depth, by modulating the applied moment as a function of active depth control feedback.

Equations 12 and 13 describe how KI and KII stress intensity factors change with applied loading. Using an adiabatic heating source, KII cancellation is possible with positive P and M. Referring to FIG. 4, this combination is possible by film shock heating.

An E-Beam is effective in meeting the required specifications. FIG. 8 shows a Monte Carlo simulation of the energy deposition heating profile for a 100 keV electron beam in silicon. If the energy is deposited rapidly compared to the thermal diffusion time constant of the system, this profile also represents the instantaneous temperature profile and thermoelastic stress profile imparted to the system.

By varying beam intensity and energy, M and P can be simultaneously adjusted to a desired combination that can result in energy or KII controlled propagation. With electron energies of 1 MeV or less, the general shape of the volumetric heating profile has been found to be energy independent and only scale in depth.

For example, a solution of equations 12 and 13 with a simulated electron energy deposition profile can show the effectiveness of this method to generate KII controlled propagation. FIG. 9 shows the simulated E-Beam Profile with a peak temperature of 635° C. and peak position of about 5.35 um within the film. This will generate, assuming unity coupling of M and P into the crack tip, a moment $M\sim 8\times 10^{-2}$ N-m/m and force $P\sim 4.3\times 10^3$ N/m. The resulting KI just exceeds 2.4 J/m$^2$ and KII is cancelled.

FIG. 10 shows the cleave energy contribution from each stress intensity component (KI$^2$/E' as D1 and (KII$^2$/E' as D2). The KII=0 condition corresponds to D2=0 while the D1 energy is set to just exceed 2.4 J/m$^2$. Note that $\alpha_{CTE}$ is assumed to be 3.5 ppm which is more accurate at the 600-700° C. temperature range. This KII=0 condition would make the fracture propagate horizontally along the desired depth h=50 um.

This condition should allow the crack to propagate some distance until arresting. Since the crack cleave velocity is much faster than the thermal time constant of the system, this temperature profile will persist and not thermally diffuse through the cleaving process.

E-beam spot sizes of about 500 um to a few millimeters should extend the crack to about the same length scale. After thermal relaxation of the thermal pulse, the process can repeat to move the crack another increment.

The aforementioned was described using a pulsed beam on a film area next to the crack tip. Alternatively, a CW or pulsed beam could perform the same function in a scanning manner along the cleave tip (into the figure). By tuning the beam intensity to impart the same temperature-time profile using the beam spot displacement velocity, the scanning beam could extend the crack dynamically in synchronicity with the scanning beam. Control over depth could therefore be made by modulating the beam energy and intensity while the crack is propagating to achieve the desired depth. This suggests that reduced dose or even no dose propagation is possible using this technology.

Use of Thermal Shock Technologies for Film Initiation

The use of a patterned implant was described above in connection with allowing the lowest total dose film cleaving process. In the proposed process sequence, film initiation would be made on a higher dose area to partially release a film of a few millimeters in width. This partially released film can in turn can be used to propagate the balance of the cleaving under KII cancellation or other methods of film propagation.

The E-beam technology, laser, or flashlamp technologies could be used to detach the film from the substrate. The E-beam technology may be particularly suited for this purpose, as the energy range could be adjusted to allow film temperature to rise volumetrically within the initiation area close to the edge of the substrate. The pulsed energy would deposit over time within the film thickness, an almost constant $\Delta T$ rise in temperature, with a sharp change in temperature profile adjusted located at or near to the cleave plane.

Such adiabatic heating of silicon by E-beam exposure is shown in FIG. 9, which plots energy density versus depth into silicon, for E-beam irradiation over a time period. The beam intensity and energy are chosen to correspond to a KII controlled propagation. In this 50 um film cleaving example on (111) silicon, KII is cancelled with a peak thermal depth of 5.35 um.

For example, a 250 nsec pulse would only diffuse the thermal profile by about 5 um, substantially less than the film thickness. This would generate a cleave action that would limit the presence of thermal shocks across the thickness of the film, and produce KI and KII components that can controllably cleave the film. The initiation cleaving could start at an edge and be extended to cover the desired film width to support the propagation cleave method. Alternatively, the initiation cleaving could start at an interior location and then extend to the periphery. If an internal initiation cleaving is used, a vacuum environment would benefit the cleaving process by reducing the energy needed for film buckling since there will not be any appreciable pressure developing a restoring force to the upwards film movement.

Use of Adiabatic Thermal Technologies for Film Propagation

An intense thermal pulse in combination with volumetric heating characteristics could also be used to propagate the film from the initiation region. With E-beam technology in particular, a fast pulse application that can heat the film thickness uniformly, could allow the controlled propagation of the film by pure shear cleaving or with a moment assist. The use of E-Beam technology for cleaving of films is described in U.S. Pat. No. 6,013,563, which is incorporated by reference in its entirety herein for all purposes. In accordance with particular embodiments of the present invention, the E-Beam radiation may be applied in a direction perpendicular to a face of the substrate.

The matching of the E-beam volumetric heating (volumetric heating shape and peak thermal temperature Rp) can be made by selecting a higher or lower energy e-beam. The E-beam energy can be selected so that its Rp is within the thickness of the film to be cleaved in order to generate the desired moment M.

The use of E-beam radiation may be particularly favored here because the energy range could be adjusted to allow a film temperature rise volumetrically within the film close to the crack tip. The pulsed energy would deposit within the film thickness, a sharp change in temperature profile adjusted to develop the desired M and P loading.

For example, a 250 nsec pulse would only diffuse the thermal profile by about 5 um, substantially less than the film thickness. This would generate a shear cleave that would limit the presence of thermal shocks across the thickness of the film and produce a large shear that can controllably cleave the film.

The use of E-beam heating methods would be beneficial in this mode, since the rapid adiabatic heating will give a sharp compressive stress profile that can help guide the propagating cleave. Cleave depth could also be controlled by altering the E-beam energy, thus changing the thickness of the film that is subjected to volumetric heating.

Selection of the heated zone width was also confirmed to yield control over cleave extension. The heated zone width will dictate, to first order, the amount of crack extension that will occur upon the heating cycle. This is because after the cleave front has reached the edge of the heated cleave area, G' will drop and the propagating cleave will arrest.

Lastly, any of the heating techniques used in conjunction with an implanted cleave layer could help use the implant induced stresses more efficiently. This would occur by the higher temperature, which would in turn increase the implant stresses (these are usually proportional to kT). A heated pulse could therefore have a secondary, favorable effect on the cleave plane, enhancing stresses in the cleave plane for better guidance of cleave propagation.

The continuation of the cleave process would eventually result a complete lift off of a thick film along the cleave region, out of the remaining portion of the semiconductor substrate. In one embodiment, this remaining portion with a newly exposed surface region, is in condition for repeating the cleaving method by again performing the cleave initiation and propagation methods.

A cleavage plane of lower surface energy may be selected as the surface region for the semiconductor substrate. Thus, in an embodiment, after one thick film is lifted off from the substrate, a new surface plane would be substantially in the original crystallographic plane and in a good condition, with relatively small surface roughness for additional layer transfer production without need of complicated surface treatment like etching or polishing.

Of course, there can be other variations, modifications, and alternatives. Depending upon the embodiment, the processes can be for the formation of photovoltaic cells, integrated circuits, optical devices, any combination of these, and the like.

While the above is a full description of the specific embodiments, various modifications, alternative sequences and devices may be used. Although the above has been described using a selected sequence of steps, any combination of any elements of steps described as well as others may be used. Additionally, certain steps may be combined and/or eliminated depending upon the embodiment.

Furthermore, the type of ionic particles can be varied from hydrogen ions to helium ions, deuterium ions, or certain combinations to allow for formation of the cleave region according to alternative embodiments. Still further, the cleaving process may include temperature controlled/assisted cleaving utilizing vacuum chucking or electrostatic chucking process. Of course there can be other variations, modifications, and alternatives.

Therefore, it is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for cleaving a film of material from a substrate, the method comprising:
   providing a substrate having a face and a stressed layer located at a depth below the face;
   initiating cleaving within a vicinity of the stressed layer; and
   applying external energy to propagate the cleaving using the stressed layer in a controlled manner, wherein propagation above the stressed layer is favored by a KII factor but energetically cannot be supported, such that the stressed layer serves as a barrier to propagation below the depth.

2. The method of claim 1 wherein cleaving is initiated at a location within about 5% of the depth.

3. The method of claim 1 wherein cleaving is initiated at a location within about 10% of the depth.

4. The method of claim 1 further comprising forming the stressed layer by implanting particles.

5. The method of claim 4 wherein the particles comprise hydrogen or helium.

6. The method of claim 1 further comprising forming the stressed layer by deposition.

7. The method of claim 1 wherein the external energy is thermal energy applied in two steps.

8. The method of claim 7 wherein a first step comprises a thermal soak to raise an absolute temperature within the stressed layer, and a second step comprises a thermal pulse to raise a temperature differential between material above the stressed layer and the substrate.

9. The method of claim 8 wherein a timing of the application of the thermal soak and thermal pulse steps is determined based upon a thermal time constant of the film.

10. The method of claim 1 wherein the external energy is thermal energy applied in a single step.

11. The method of claim 10 wherein a timing of the application of the external thermal energy is determined based upon an acoustic time constant of the film.

12. The method of claim 1 wherein the external energy is thermal energy applied at a point deeper than one-half the thickness of the substrate to generate a negative force P and a positive moment M causing separation of the film from the substrate.

13. The method of claim 1 wherein the external energy is thermal energy applied as a beam of electrons, photons, or electromagnetic energy.

14. The method of claim 1 wherein the external energy is mechanical energy applied as moment M and force P imparted on the film.

15. The method of claim 14 wherein the mechanical energy is applied energy applied using ultrasonic excitation of the film.

16. The method of claim 14 wherein the mechanical energy is applied by pushing utilizing a wedge or a wire inserted between the film and the substrate.

17. The method of claim 14 wherein the mechanical energy is applied by pulling utilizing vacuum suction or electrostatic attraction on the face from above.

18. The method of claim 1 wherein the external energy is a combination of thermal and mechanical energy imparted on the film and substrate area near the crack tip.

19. A method for cleaving a film of material from a substrate, the method comprising:
   providing a substrate having a face;
   initiating cleaving at a depth in the substrate to release an overlying film; and
   applying external thermal energy to propagate the cleaving in a controlled manner such that a KII factor is maintained at or about zero along the depth.

20. The method of claim 19 wherein the thermal energy is applied to the face to adiabatically heat the film and generate a positive force (P) and a positive moment (M) resulting in separation of the film.

21. The method of claim 19 wherein the thermal energy is applied as a beam of electrons, photons, or electromagnetic energy.

22. The method of claim 19 wherein the thermal energy is applied as a thermal sink to a portion of the substrate other than the film to generate a positive force (P) and a positive moment (M) resulting in separation of the film.

23. The method of claim 19 further comprising forming a stressed layer at the depth by implanting particles into the face.

24. The method of claim 23 wherein the particles comprise hydrogen or helium.

25. The method of claim 19 wherein additional external energy is applied as mechanical energy as a moment M and a force P imparted on the film.

26. The method of claim 25 wherein the applied mechanical energy is applied using ultrasonic excitation of the film.

27. The method of claim 25 wherein the mechanical energy is applied by inserting a wedge or wire between the film and the substrate.

28. The method of claim 25 wherein the mechanical energy is applied by pulling on the film from above utilizing vacuum suction or electrostatic attraction.

29. A method for cleaving a film of material from a substrate, the method comprising:
   providing a substrate having a face and a stressed layer located at a depth below the face;
   initiating cleaving within a vicinity of the stressed layer;
   applying external thermal energy in two steps to propagate the cleaving using the stressed layer in a controlled manner,
   wherein a first step comprises a thermal soak to raise an absolute temperature within the stressed layer, and a second step comprises a thermal pulse to raise a temperature differential between material above the stressed layer and the substrate, and
   wherein propagation above the stressed layer is favored by a KII factor but energetically cannot be supported, such that the stressed layer serves as a barrier to propagation below the depth.

30. The method of claim 29 wherein cleaving is initiated at a location within about 5% of the depth.

31. The method of claim 29 wherein cleaving is initiated at a location within about 10% of the depth.

32. The method of claim 29 further comprising forming the stressed layer by implanting particles.

33. The method of claim 32 wherein the particles comprise hydrogen or helium.

34. The method of claim 29 wherein a timing of the application of the thermal soak and thermal pulse steps is determined based upon a thermal time constant of the film.

* * * * *